United States Patent
Lee et al.

(10) Patent No.: US 9,436,031 B2
(45) Date of Patent: Sep. 6, 2016

(54) LIQUID CRYSTAL DISPLAY AND MANUFACTURING METHOD THEREOF

(71) Applicant: Samsung Display Co., Ltd., Yongin (KR)

(72) Inventors: Bo Ram Lee, Seongnam-si (KR); Sang Il Kim, Yongin-si (KR); Yong Seok Kim, Seoul (KR); Seung-Jin Baek, Suwon-si (KR); Dong-Min Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/592,596

(22) Filed: Jan. 8, 2015

(65) Prior Publication Data

US 2016/0004111 A1    Jan. 7, 2016

(30) Foreign Application Priority Data

Jul. 7, 2014 (KR) .......................... 10-2014-0084664

(51) Int. Cl.
  *H01L 27/32*  (2006.01)
  *G02F 1/1333* (2006.01)
  *H01L 27/12*  (2006.01)
  *G02F 1/1368* (2006.01)

(52) U.S. Cl.
  CPC ......... *G02F 1/13338* (2013.01); *G02F 1/1368* (2013.01); *G02F 1/133345* (2013.01); *G02F 1/133377* (2013.01); *H01L 27/1262* (2013.01); *H01L 27/323* (2013.01); *H01L 27/3241* (2013.01); *H01L 27/3244* (2013.01)

(58) Field of Classification Search
  CPC ............. H01L 27/323; H01L 27/3241; H01L 27/3244
  See application file for complete search history.

(56) References Cited

U.S. PATENT DOCUMENTS

| | | | |
|---|---|---|---|
| 2006/0146267 A1* | 7/2006 | Choi ................. | G02F 1/133377 349/156 |
| 2008/0278070 A1* | 11/2008 | Kim ..................... | G06F 3/0412 313/504 |
| 2014/0198290 A1 | 7/2014 | Lim et al. | |
| 2014/0347284 A1 | 11/2014 | Lee et al. | |
| 2015/0185903 A1* | 7/2015 | Park ...................... | G06F 3/044 345/173 |

FOREIGN PATENT DOCUMENTS

| | | |
|---|---|---|
| KR | 10-2013-0109288 | 10/2013 |
| KR | 10-2014-0095120 | 8/2014 |
| KR | 10-2014-0139261 | 12/2014 |
| KR | 10-2015-0025204 | 3/2015 |

* cited by examiner

*Primary Examiner* — Phat X Cao
(74) *Attorney, Agent, or Firm* — H.C. Park & Associates, PLC

(57) ABSTRACT

A liquid crystal display including: a substrate; a thin film transistor disposed on the substrate; a pixel electrode connected to the thin film transistor; a lower insulating layer facing the pixel electrode; and a touch sensor disposed on the lower insulating layer, the touch sensor including a first transparent conductive layer and a second transparent conductive layer. A plurality of microcavities is formed between the pixel electrode and the lower insulating layer.
The microcavities form a liquid crystal layer including a liquid crystal material, the lower insulating layer has a matrix shape including a horizontal portion and a vertical portion, and the second transparent conductive layer overlaps the vertical portion of the lower insulating layer.

11 Claims, 37 Drawing Sheets

LIQUID CRYSTAL DISPLAY AND MANUFACTURING METHOD THEREOF

CROSS-REFERENCE TO RELATED APPLICATION

This application claims priority to and the benefit of Korean Patent Application No. 10-2014-0084664, filed on Jul. 7, 2014, which is hereby incorporated by reference for all purposes as if fully set forth herein.

BACKGROUND

1. Field

Exemplary embodiments of the present disclosure relate to a liquid crystal display and a manufacturing method thereof.

2. Discussion of the Background

A liquid crystal display, which is one of flat panel displays most widely used at present, includes two display panels on which electric field generating electrodes, such as a pixel electrode and a common electrode, are formed. A liquid crystal layer is inserted between the pixel electrode and the common electrode.

The liquid crystal display displays an image by generating an electric field on a liquid crystal layer by applying a voltage to the electric field generating electrodes, determining alignments of liquid crystal molecules of the liquid crystal layer through the generated electric field, and controlling polarization of incident light.

A technique of forming a plurality of microcavities in a pixel and filling the same with liquid crystals to implement a display has recently been developed for the liquid crystal display. Although two sheets of substrates are used in a conventional liquid crystal display, this technique forms constituent elements on only one substrate, thereby reducing weight, thickness, and the like of the device.

Flat panel displays, including liquid crystal displays, perform functions by using various input devices. Recently, an input device disposed with a touch panel has been widely used.

The touch panel may allow a machine, such as a computer, to perform a desired command by writing a character, drawing a picture, or executing an icon through touching a finger or a touch pen (or stylus) on a screen. A display device to which the touch panel is attached can determine whether a user's finger, a touch pen, etc., touches a screen, and then display the touch position information thereof. These touch panels may generally be classified as a resistive type, a capacitive type, and an electro-magnetic (EM) type, according to the sensing method of the touch.

The touch panel may be attached on the upper substrate or the flat layer of the flat panel display, such as the liquid crystal display, or may be implemented in the liquid crystal display.

The above information disclosed in this Background section is only for enhancement of understanding of the background of the inventive concept and, therefore, it may contain information that does not constitute prior art.

SUMMARY

Exemplary embodiments provide a liquid crystal display including a touch sensor, and a manufacturing method thereof.

Additional aspects will be set forth in the detailed description which follows, and, in part, will be apparent from the disclosure, or may be learned by practice of the inventive concept.

An exemplary embodiment of the present invention discloses a liquid crystal display including: a substrate; a thin film transistor disposed on the substrate; a pixel electrode connected to the thin film transistor; a lower insulating layer facing the pixel electrode; and a first transparent conductive layer and a second transparent conductive layer disposed on the lower insulating layer and forming a touch sensor. A plurality of microcavities is formed between the pixel electrode and the lower insulating layer, the microcavities forming a liquid crystal layer including a liquid crystal material. The lower insulating layer has a matrix shape including a horizontal portion and a vertical portion, and the second transparent conductive layer is disposed to overlap the vertical portion of the lower insulating layer.

An exemplary embodiment of the present invention also discloses a method for manufacturing a liquid crystal display, including: forming a thin film transistor on a substrate; forming a pixel electrode substrate on the thin film transistor; forming a sacrificial layer on the pixel electrode; forming a lower insulating layer on the sacrificial layer; forming a touch sensor on the lower insulating layer, the touch sensor comprising a first transparent conductive layer and a second transparent conductive layer; forming a plurality of microcavities by removing the sacrificial layer; and injecting a liquid crystal material in the microcavities. The lower insulating layer is formed in a matrix and includes a horizontal portion and a vertical portion, and the second transparent conductive layer is formed to overlap the vertical portion of the lower insulating layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept and, together with the description, serve to explain principles of the inventive concept.

DETAILED DESCRIPTION OF THE ILLUSTRATED EMBODIMENTS

Figure 1:
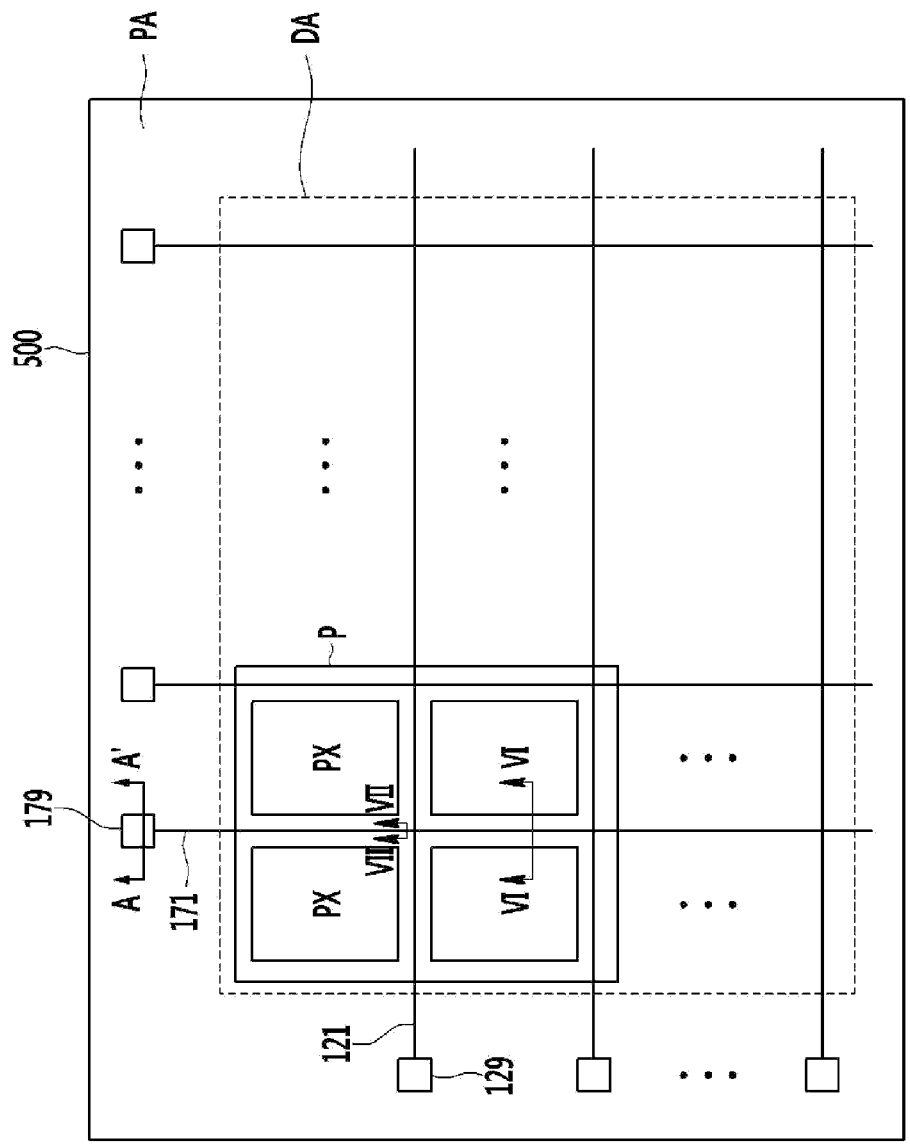
FIG. 1 is a layout view of a liquid crystal display according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A liquid crystal display according to an exemplary embodiment of the present invention will now be described with reference to FIG. 1 to FIG. 7.

Figure 2:
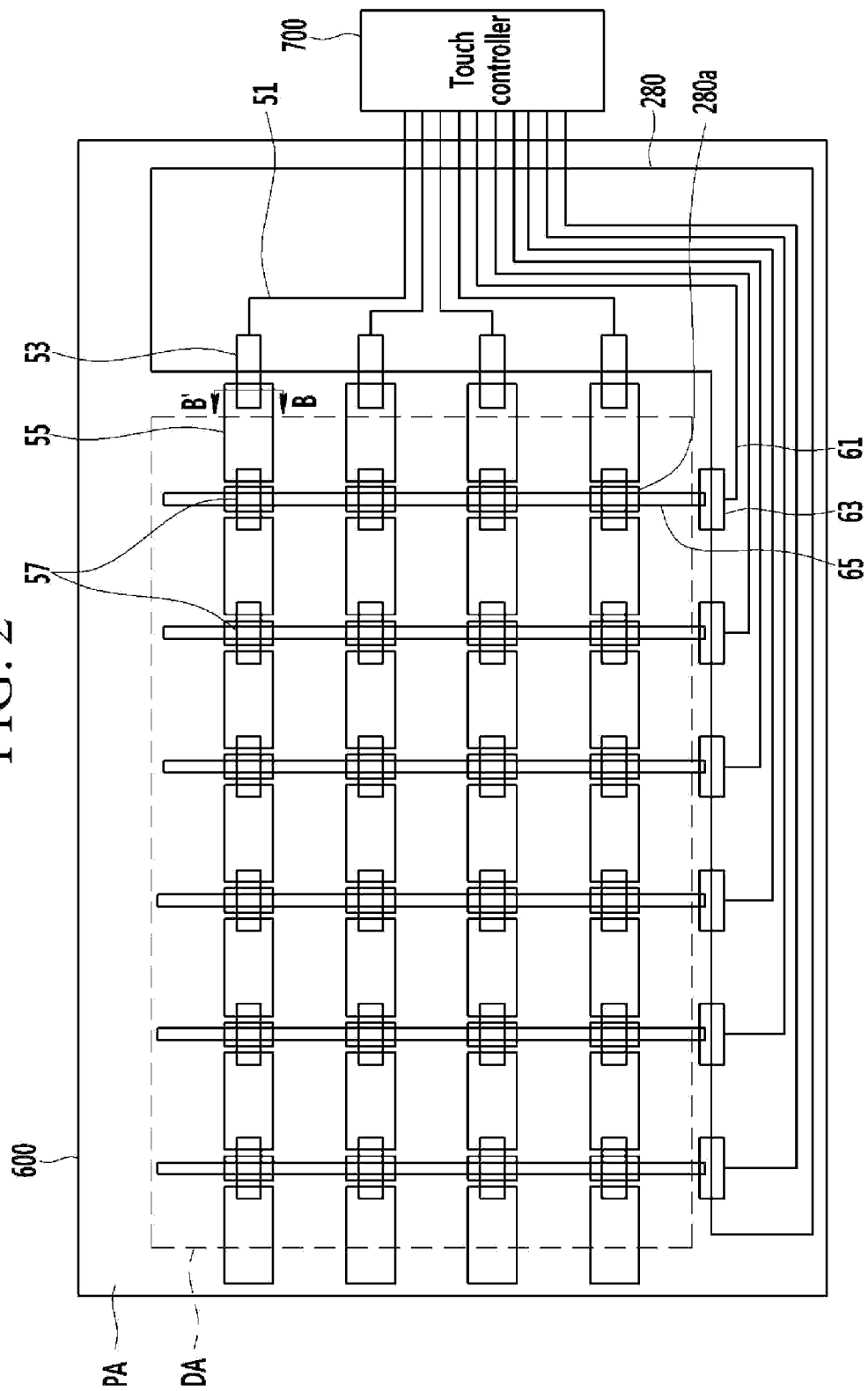
FIG. 2 shows a layout view illustrating a touch region in a liquid crystal display according to an exemplary embodiment of the present invention.

Referring to FIG. 1 and FIG. 2, the liquid crystal display includes a display panel 500 on which a plurality of pixels PX are disposed, a touch panel 600, and a touch controller 700. In the present exemplary embodiment, the touch panel 600 may be disposed on the display panel 500, for example. In detail, the touch panel 600 may be disposed on the uppermost layer of the display panel 500.

The display panel 500 includes a display area (DA) for displaying an image and a peripheral area (PA) that is disposed near the display area (DA).

Gate lines 121, data lines 171, and a pixels PX connected to the gate lines 121 and the data lines 171 are disposed n the display area DA.

The gate lines 121 are extended substantially in a row direction and substantially parallel to each other, and transmit a gate signal. The gate lines 121 respectively include a gate pad 129 for accessing a gate driver (not shown). When the gate driver is integrated on the display panel 500, the gate pad 129 can be directly connected to the gate driver. The gate pad 129 can be disposed in the peripheral area (PA).

The data lines 171 transmit a data voltage corresponding to an image signal, and are extended substantially in a column direction and substantially parallel to each other. The data lines 171 can include a data pad 179 for accessing a data driver (not shown). When the data driver is integrated on the display panel 500, the data pad 179 can be directly connected to the data driver. The data pad 179 can be disposed in the peripheral area (PA).

Pixels PX are arranged substantially in a matrix. Each pixel PX can include a switching element (not shown) connected to the corresponding gate line 121 and the corresponding data line 171, and a pixel electrode (not shown) connected thereto. The switching element can be a three-terminal element, such as a thin film transistor, integrated on the display panel 500. The switching element is turned on or turned off by the gate signal of the gate line 121 to selectively transmit the data signal disposed by the data line 171 to the pixel electrode.

Referring to FIG. 2, a first touch signal line 51 and a second touch signal line 61 are disposed in the peripheral area (PA) of the touch panel 600, and a first transparent conductive layer 55 and a second transparent conductive layer 65 are disposed in the display area (DA).

The first touch signal line 51 receives a touch input signal from the touch controller 700, and transmits the touch input signal to the first transparent conductive layer 55.

The first touch signal line 51 is connected to a first pad 53, and the touch input signal is transmitted to the first transparent conductive layer 55 through the first pad 53.

The second touch signal line 61 receives a touch output signal from the second transparent conductive layer 65, and transmits it to the touch controller 700.

The second touch signal line 61 is connected to a second pad 63, and the touch output signal is transmitted to the touch controller 700 through the second pad 63.

Referring to FIG. 1 and FIG. 2, the first pad 53 and the second pad 63 are respectfully disposed on the right and the bottom of the display area (DA), and the gate pad 129 and the data pad 179 are respectfully disposed on the left and the top of the display area (DA). As described, in the present exemplary embodiment, the touch pad, including the first pad 53 and the second pad 63, can be disposed in a region that does not overlap the pixel pad, including the gate pad 129 and the data pad 179.

The first touch signal line 51 including the first pad 53, and the second touch signal line 61 including the second pad 63, can be formed with a conductive material such as a metal, and they can be formed on the same layer in the same process.

According to another exemplary embodiment of the present invention, the functions of the first touch signal line 51 and the second touch signal line 61 are interchangeable. For example, the second touch signal line 61 receives the touch input signal from the touch controller 700 and transmits it to the second transparent conductive layer 65, and the first touch signal line 51 receives the touch output signal from the first transparent conductive layer 55 and transmits it to the touch controller 700.

Figure 3:
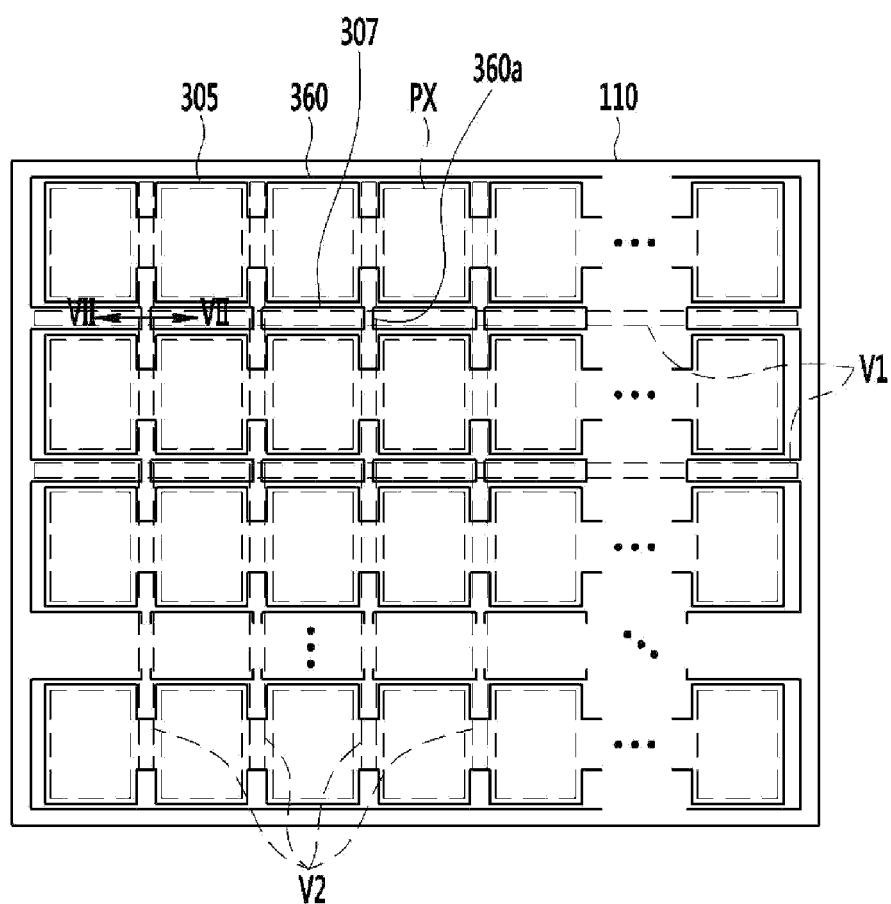
FIG. 3 shows a layout view illustrating a roof layer in a liquid crystal display according to an exemplary embodiment of the present invention.

Referring to FIG. 3, a substrate 110 includes pixels PX. The pixels PX are disposed in a matrix including pixel rows and pixel columns. A first trench V1 is disposed between the pixel rows, and a second trench V2 is disposed between of the pixel columns. The arrangement of the pixels PX is not limited thereto and may be varied.

The display panel 500 and the touch panel 600 of a liquid crystal display according to an exemplary embodiment of the present invention will now be described with reference to FIG. 4 to FIG. 6.

Figure 4:
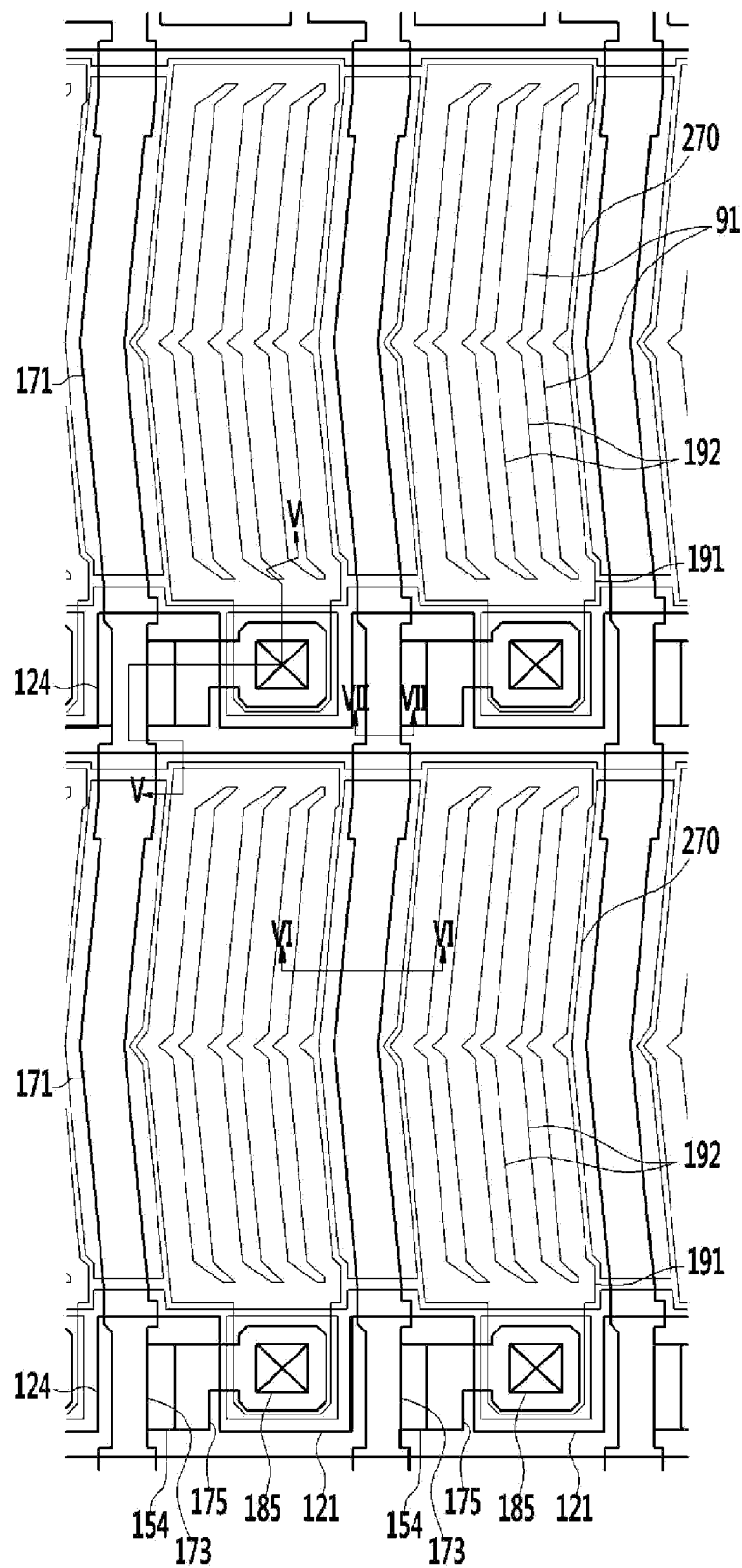
FIG. 4 shows a top plan view illustrating an enlarged P region of FIG. 1.
Figure 5:
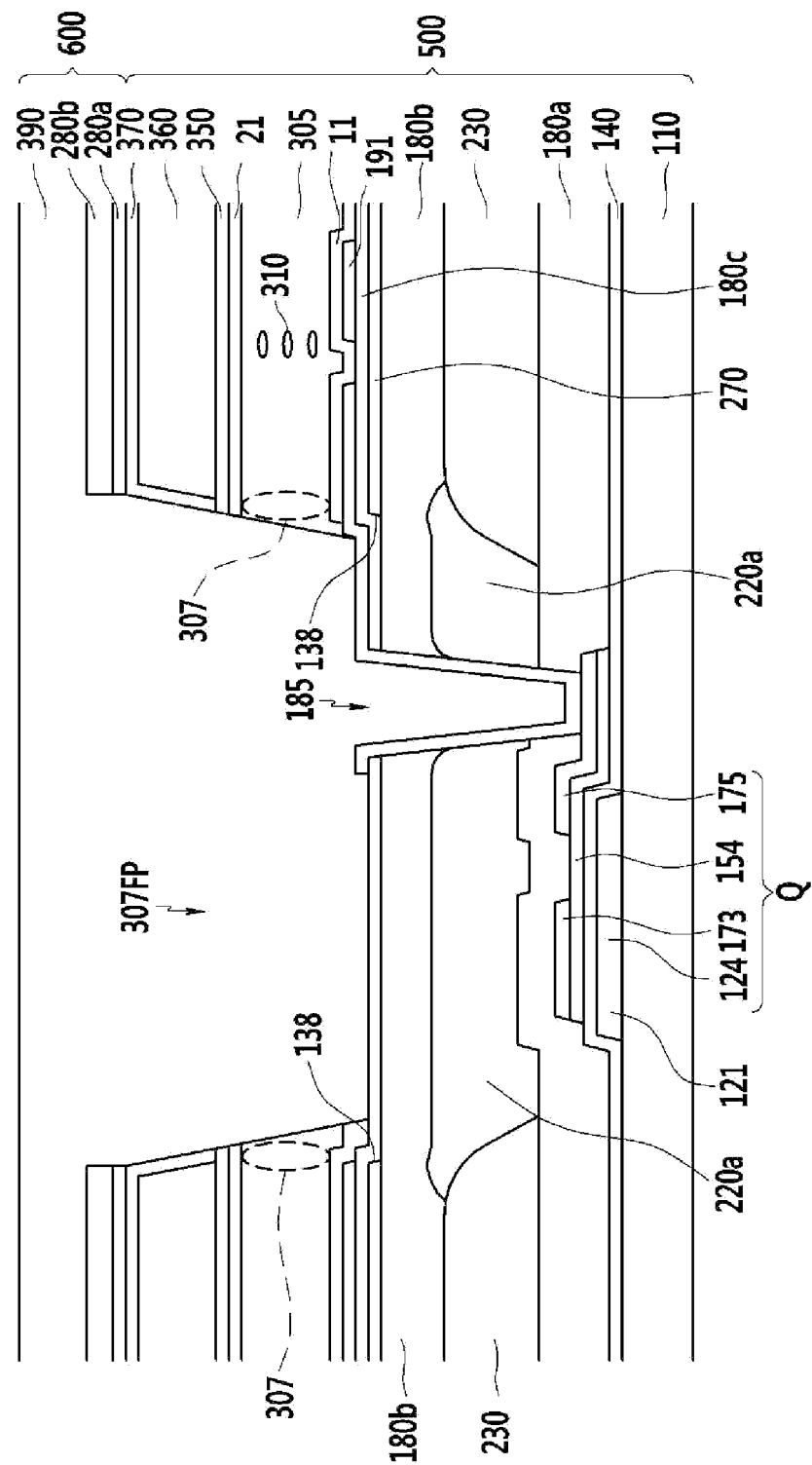
FIG. 5 shows a cross-sectional view with respect to a line V-V of FIG. 4.
Figure 6:
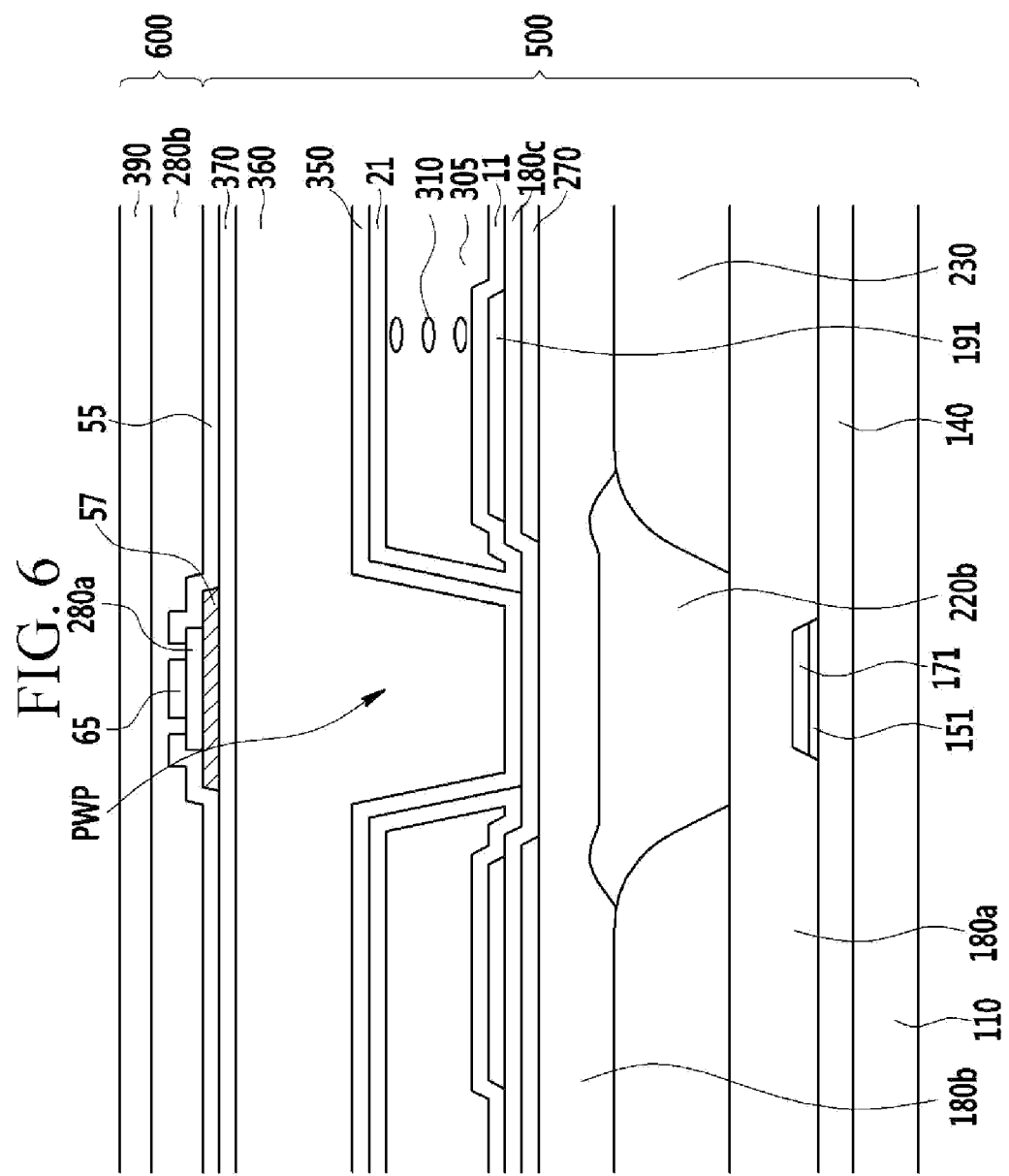
FIG. 6 shows a cross-sectional view with respect to a line VI-VI of FIG. 4.

Referring to FIG. 4 to FIG. 6, a gate line 121 is formed on a substrate 110 made of transparent glass or plastic. The gate line 121 includes a wide end portion (129 in FIG. 1) for accessing a gate electrode 124 and another layer or an external driving circuit. The gate line 121 may be made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), and the like. However, the gate line 121 may have a multilayer structure including at least two conductive layers with different physical properties.

A gate insulating layer 140 made of a silicon nitride ($SiN_x$) or a silicon oxide ($SiO_x$) is formed on the gate line 121. The gate insulating layer 140 may have a multilayer structure including at least two insulating layers with different physical properties. A semiconductor layer 151 disposed at a lower part of the data line 171, a semiconductor layer 154 disposed at a lower part of source/drain electrodes 173, 175, and a channel of a thin film transistor (Q) are formed on the gate insulating layer 140. The semiconductor layer 154 can be made of amorphous silicon or polysilicon, or it can be formed with an oxide semiconductor.

Ohmic contacts (not shown) may be formed on the semiconductor layers 151 and 154 and between the data line 171 and the source/drain electrodes 173, 175.

Data conductors 171, 173, and 175, including a source electrode 173, a data line 171 connected to the source electrode 173, and a drain electrode 175, are formed on the semiconductor layers 151 and 154 and the gate insulating layer 140. The data line 171 includes a wide end portion 179 (shown in FIG. 1) for accessing another layer or an external driving circuit. The data line 171 transmits a data signal and is mainly extended in a longitudinal direction to cross the gate line 121.

The source electrode 173 is a part of the data line 171 and is disposed on the same line as the data line 171. The drain electrode 175 is formed to be parallel to the source electrode is 173. Therefore, the drain electrode 175 is parallel to part of the data line 171. The source electrode 173 and the drain electrode 175 may also be configured in other ways.

The gate electrode 124, the source electrode 173, and the drain electrode 175 form a thin film transistor (Q) together with the semiconductor layer 154, and the channel of the thin film transistor (Q) is formed on the semiconductor layer 154 between the source electrode 173 and the drain electrode 175.

The data line 171 and the drain electrode 175 may be made of a refractory metal, such as molybdenum, chromium, tantalum, titanium, or an alloy thereof, and they may have a multilayer structure including a refractory metal layer (not shown) and a low resistance conductive layer (not shown). Examples of the multilayered structure may include a double layer including a chromium or molybdenum (alloy) lower layer and an aluminum (alloy) upper layer, and a triple layer including a molybdenum (alloy) lower layer, an aluminum (alloy) intermediate layer, and a molybdenum (alloy) upper layer.

A first protection layer 180a is formed on the data conductors 171, 173, and 175 and the exposed semiconductor layer 154. The first protection layer 180a may include an inorganic insulator or an organic insulator, such as a silicon nitride ($SiN_x$) or a silicon oxide ($SiO_x$).

A color filter 230 and a light blocking member 220 may be formed on the first protection layer 180a.

The light blocking member 220 is formed to have a lattice structure having an opening that corresponds to a region for displaying an image, and it is formed with a material through which light may not pass. The color filter 230 is formed in the opening of the light blocking member 220. The light blocking member 220 includes a horizontal light blocking member 220a formed in parallel with the gate line 121, and a perpendicular light blocking member 220b formed in parallel with the data line 171.

The color filter 230 displays primary colors including red, green, and blue. However, the colors are not limited to these three primary colors, and the color filter 230 may also display at least one of a cyan-based color, a magenta-based color, a yellow-based color, and a white-based color. The color filter 230 may be formed of materials displaying different colors for each adjacent pixel PX.

A second protection layer 180b is formed on the color filter 230 and the light blocking member 220 to cover the same. The second interlayer insulating layer 180b may include an inorganic insulator, such as a silicon nitride ($SiN_x$) or a silicon oxide ($SiO_x$), or an organic insulator. Unlike those illustrated in the cross-sectional view of FIG. 2, when a step is generated due to a thickness difference between the color filter 230 and the light blocking member 220, the second protection layer 180b includes the organic insulator to reduce or remove the step.

A contact hole 185 for exposing the drain electrode 175 is formed in the color filter 230, the light blocking member 220, and the protection layers 180a and 180b.

A common electrode 270 is disposed on the second protection layer 180b. The common electrode 270 may have a planar shape, may be formed on the entire surface of the substrate 110 as a whole plate, and has an opening 138 disposed in a region corresponding to a periphery of the drain electrode 175. That is, the common electrode 270 can have a plate-type plane form.

Common electrodes 270 disposed to adjacent pixels PX are connected to each other and receive a predetermined common voltage supplied from outside of the display area.

An inter-layer insulating layer 180c is disposed on the common electrode 270. The inter-layer insulating layer 180c can be formed with an organic insulating material or an inorganic insulating material.

A pixel electrode 191 is disposed on the inter-layer insulating layer 180c. The pixel electrode 191 may be made of a transparent conductive material, such as ITO or IZO. The pixel electrode 191 includes a plurality of cutouts 91, and also includes a plurality of branch electrodes 192 disposed between the neighboring cutouts.

The contact hole 185 for exposing the drain electrode 175 is formed in the first protection layer 180a, the second protection layer 180b, and the inter-layer insulating layer 180c. The pixel electrode 191 is physically and electrically connected to the drain electrode 175 through the contact hole 185, and receives a voltage from the drain electrode 175.

The common electrode 270 is a first field generating electrode or a first electrode, and the pixel electrode 191 is a second field generating electrode or a second electrode. The pixel electrode 191 and the common electrode 270 can form a horizontal electric field. The pixel electrode 191 and the common electrode 270 function as field generating electrodes to generate an electrical field such that liquid crystal molecules 310 disposed on the pixel electrode 191 and the common electrode 270 are rotated in a direction parallel to the direction of the electric field. As described above, according to the determined rotation direction of the liquid crystal molecules, the polarization of light passing through the liquid crystal layer is changed.

The common electrode 270 has a planar shape, and the pixel electrode 191 has a plurality of branch electrodes 192. However, in a liquid crystal display according to another exemplary embodiment of the present invention, the pixel electrode 191 may have a planar shape and the common electrode 270 may have the plurality of branch electrodes 192.

The present invention is applied to all cases in which two field generating electrodes overlap each other via the insulating layer on the substrate 110, the first field generating electrode under the insulating layer has a planar shape, and the second field generating electrode on the insulating layer has a plurality of branch electrodes.

A lower alignment layer 11 is formed on the pixel electrode 191, and the lower alignment layer 11 includes an alignment material.

An upper alignment layer 21 is disposed on a part that faces the lower alignment layer 11, and a microcavity 305 is formed between the lower alignment layer 11 and the upper alignment layer 21. A liquid crystal material, including the liquid crystal molecules 310, is injected into the microcavity 305 through a liquid crystal injection hole 307.

The microcavity 305 may be formed in a column direction of the pixel electrode 191, that is, the longitudinal direction. The alignment material for forming the alignment layers 11 and 21, and the liquid crystal material including the liquid crystal molecules 310, may be injected into the microcavity 305 by using a capillary force.

The microcavity 305 is divided in the longitudinal direction by a plurality of liquid crystal injection hole forming regions 307FP disposed at a part that overlaps the gate line 121, and a plurality of microcavities are formed in a direction in which the gate line 121 is extended. The microcavities 305 may correspond to one or more pixel areas which may correspond to a region that displays a screen. As shown in FIG. 3, the liquid crystal injection hole forming region 307FP can be disposed in a first trench region V1.

A lower insulating layer 350 is disposed on the upper alignment layer 21. The lower insulating layer 350 can be formed with a silicon nitride ($SiN_x$) or a silicon oxide ($SiO_2$).

A roof layer 360 is disposed on the lower insulating layer 350. The roof layer 360 supports the microcavity 305 during formation of the microcavity 305. The roof layer 360 may include a photoresist or other types of organic materials.

In the exemplary embodiment shown in FIG. 3, the roof layer 360 includes a connector 360a for connecting roof layers 360 disposed on different pixel rows. The roof layer 360 includes a horizontal portion and the connector 360a extending in a horizontal direction along the pixel row, and it can be arranged as a matrix to include a vertical portion crossing the horizontal portion. The lower insulating layer 350 disposed at the bottom of the roof layer 360 can have the same pattern shape as the roof layer 360. Therefore, the lower insulating layer 350 can also have a horizontal portion and a vertical portion to correspond to the horizontal portion and the vertical portion of the roof layer 360, and the lower insulating layer 350 arranged as a matrix.

An upper insulating layer 370 is disposed on the roof layer 360. The upper insulating layer 370 can contact an upper side of the roof layer 360. The upper insulating layer 370 can be formed with a silicon nitride ($SiN_x$) or a silicon oxide (SiO$_2$). The upper insulating layer 370 disposed at the top of the roof layer 360 can have the same pattern shape as the roof layer 360. Therefore, the upper insulating layer 370 can include a horizontal portion and a vertical portion to correspond to the horizontal portion and the vertical portion of the roof layer 360, and the upper insulating layer 370 can be arranged as a matrix.

Figure 7:
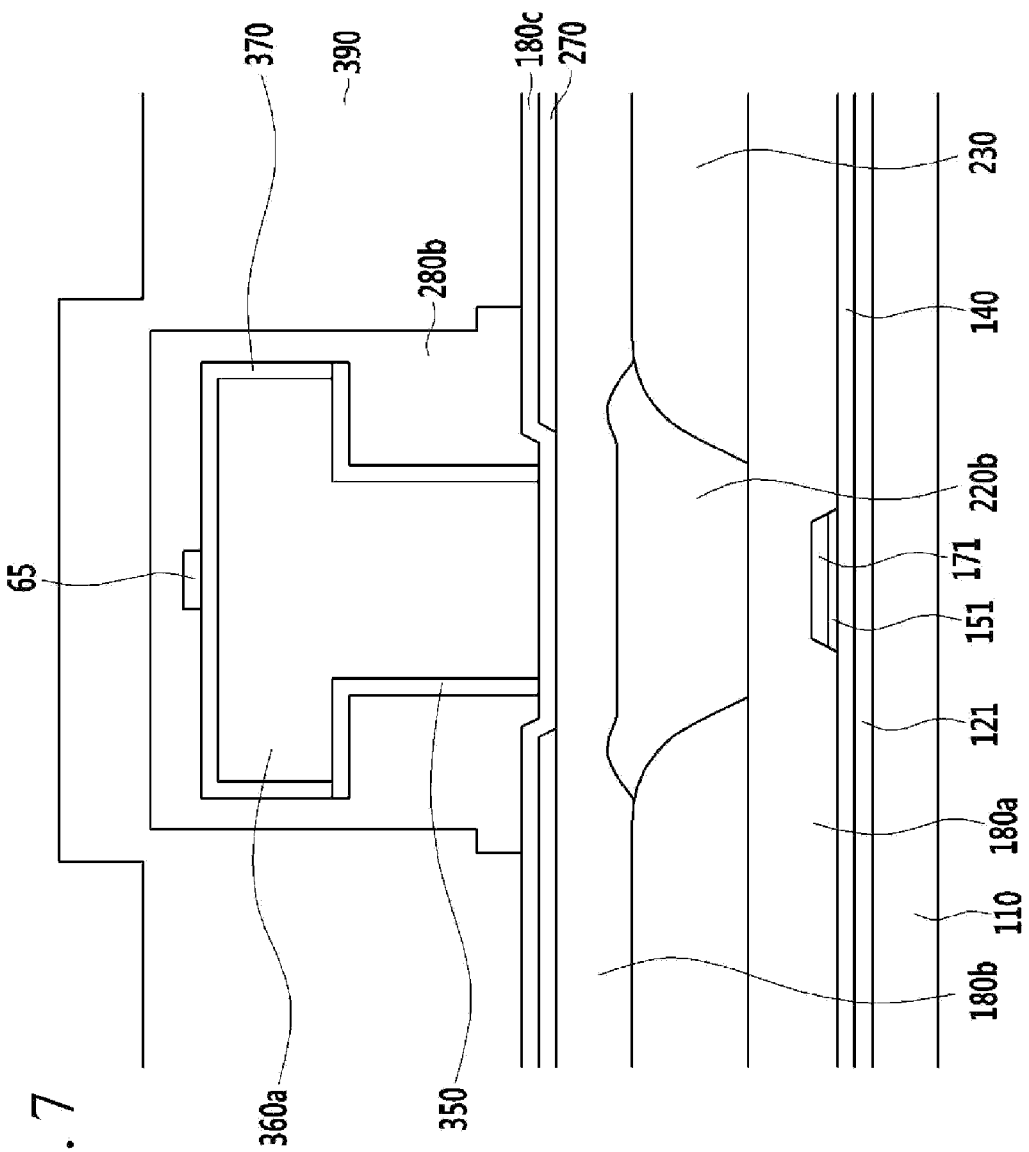
FIG. 7 shows a cross-sectional view with respect to a line VII-VII of FIG. 4.

Referring to FIG. 7, respective vertical portions of the lower insulating layer 350, the roof layer 360, and the upper insulating layer 370 cross the gate line 121. In detail, the vertical portion of the roof layer 360 crossing the gate line 121 corresponds to the connector 360a.

The configuration of the display panel 500 has been described, and a configuration of the touch panel 600 disposed on the upper insulating layer 370 will now be described.

Referring to FIG. 2, FIG. 5, FIG. 6, and FIG. 7, an island connector 57 is disposed on the upper insulating layer 370.

As shown in FIG. 2, a plurality of island connectors 57 can be separately formed.

An insulating layer 280 is disposed on the first touch signal line 51 and the second touch signal line 61. The insulating layer 280 is disposed in the peripheral area (PA) of the touch panel 600. Island-shaped first insulating layers 280a are disposed in the display area (DA).

The insulating layer 280 and the first insulating layers 280a can be configured with an inorganic insulator such as a silicon nitride (SiN$_x$) or a silicon oxide (SiO$_x$).

The first transparent conductive layer 55 and the second transparent conductive layer 65 are disposed on the insulating layer 280 and the first insulating layer 280a.

First transparent conductive layers 55 are mainly extended in the row direction and can be parallel with each other. The first transparent conductive layer 55 is electrically connected to the first pad 53, and it can receive a touch input signal from the touch controller 700 through the first pad 53 or output a touch output signal. The touch input signal and the touch output signal are collectively referred to as "touch signals".

Each first transparent conductive layer 55 can include a plurality of portions that are physically separated from each other, as shown in FIG. 2. A plurality of neighboring portions of the first transparent conductive layer 55 can be electrically connected to each other through a connection means. The connection means includes the island connector 57.

The island connector 57 can overlap the first insulating layer 280a. In further detail, a pair of sides of the island connector 57 facing each other, for example, a pair of sides facing each other in the column direction can be covered by the first insulating layer 280a. At least part of the island connector 57 may be exposed from the first insulating layer 280a. Particularly, each island connector 57 can include respective end portions that are exposed from the first insulating layer 280a.

The island connector 57 can be formed from the same material on the same layer and in the same process as the first touch signal line 51 and the second touch signal line 61.

Second transparent conductive layers 65 are mainly extended in the column direction and can be parallel with each other. The second transparent conductive layer 65 is electrically connected to the second pad 63, and the second conductive layer 65 can receive a touch input signal from the touch controller 700 through the second pad 63 or output a touch output signal.

As shown in FIG. 2, each second transparent conductive layer 65 can be configured with a single portion that is physically interconnected. The second transparent conductive layer 65 passes over the first insulating layer 280a disposed on the island connector 57, and it can be extended in the column direction. The second transparent conductive layer 65 is disposed to overlap the lower insulating layer 350 of the display panel 500, and the perpendicular portion of the roof layer 360 and/or the upper insulating layer 370.

A second insulating layer 280b is disposed on the first transparent conductive layer 55 and the second transparent conductive layer 65 to insulate the first transparent conductive layer 55 and the second transparent conductive layer 65 while crossing each other.

The first transparent conductive layer 55 and the second transparent conductive layer 65, and the first pad 53 and the second pad 63, include a transparent conductive material, such as ITO or IZO, and they can be formed with the same material and in the same process.

According to another exemplary embodiment of the present invention, the described configurations of the first transparent conductive layer 55 and the second transparent conductive layer 65 are interchangeable with each other. That is, each first transparent conductive layer 55 can be configured as a physically connected portion, and the second transparent conductive layer 65 can include a plurality of physically separated portions which can be electrically connected to each other through a connection means.

According to another exemplary embodiment of the present invention, the first transparent conductive layer 55 and the second transparent conductive layer 65 can be disposed on different layers with the second insulating layer 280b disposed therebetween. In this case, the first transparent conductive layer 55 and the second transparent conductive layer 65 can be respectively configured as a single portion extending in the row direction or the column direction.

The touch controller 700 processes the touch output signal output by the first transparent conductive layer 55 or the second transparent conductive layer 65 to determine a contact state and a contact position of the touch panel 600.

A capping layer 390 is disposed on the second insulating layer 280b. In the present exemplary embodiment, the capping layer 390 fills the liquid crystal injection hole forming region 307FP and covers the liquid crystal injection hole 307 of the microcavity 305 exposed by the liquid crystal injection hole forming region 307FP. The capping layer 390 includes an organic material or an inorganic material.

In the present exemplary embodiment, as shown in FIG. 6, a partition wall forming portion (PWP) is formed on a second trench V2 shown in FIG. 3, which is a gap between adjacent microcavities 305 in the horizontal direction. The partition wall forming portion (PWP) can be formed in the direction in which the data line 171 is extended, and it can be covered by the roof layer 360. The partition wall forming portion (PWP) is filled with the lower insulating layer 350, the upper insulating layer 370, and the roof layer 360, and this kind of structure forms a partition wall to partition or define the microcavity 305. In the present exemplary embodiment, the partition wall structure, such as the partition wall forming portion (PWP) is disposed between the microcavities 305, resulting in less stress being produced when the insulation substrate 110 is bent, and a resulting reduction in the degree of distortion of the cell gap.

Figure 8:
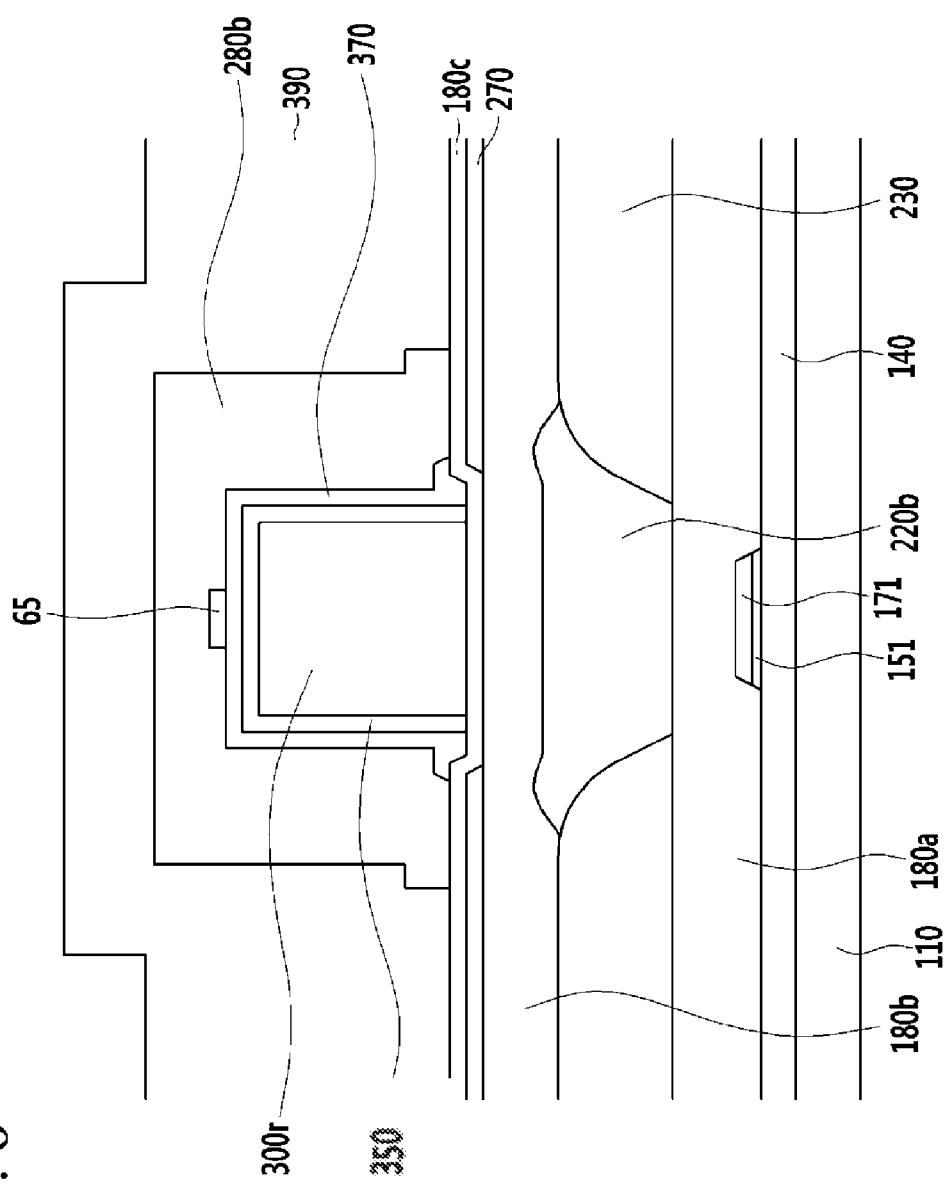
FIG. 8 shows a cross-sectional view illustrating a modified liquid crystal display according to an exemplary embodiment shown in FIG. 7.

FIG. 8 shows a cross-sectional view of a modified liquid crystal display according to an exemplary embodiment shown in FIG. 7.

Differing from the exemplary embodiment of FIG. 7, the roof layer 360 does not include connector 360a in the exemplary embodiment described with reference to FIG. 8. Roof layer 360 may be separated in a vertical direction with respect to a first trench V1.

A sacrificial layer residual film 300r is disposed at the bottom of the lower insulating layer 350 corresponding to the connector 360a in the embodiment of FIG. 8.

An upper side and a lateral side of the sacrificial layer residual film 300r can be covered by the lower insulating layer 350 and the upper insulating layer 370. The perpendicular portions of the lower insulating layer 350 and the upper insulating layer 370 cross the gate line 121, and the lower insulating layer 350 can contact the upper insulating layer 370 in the region from which the roof layer 360 is separated. The sacrificial layer residual film 300r is surrounded by the lower insulating layer 350 and the upper insulating layer 370, and it may be a remainder that is not removed during the process for removing the sacrificial layer.

In addition to the above-described differences, the contents that are described with reference to FIG. 1 to FIG. 7 are applicable to the exemplary embodiment of FIG. 8.

Figure 9:
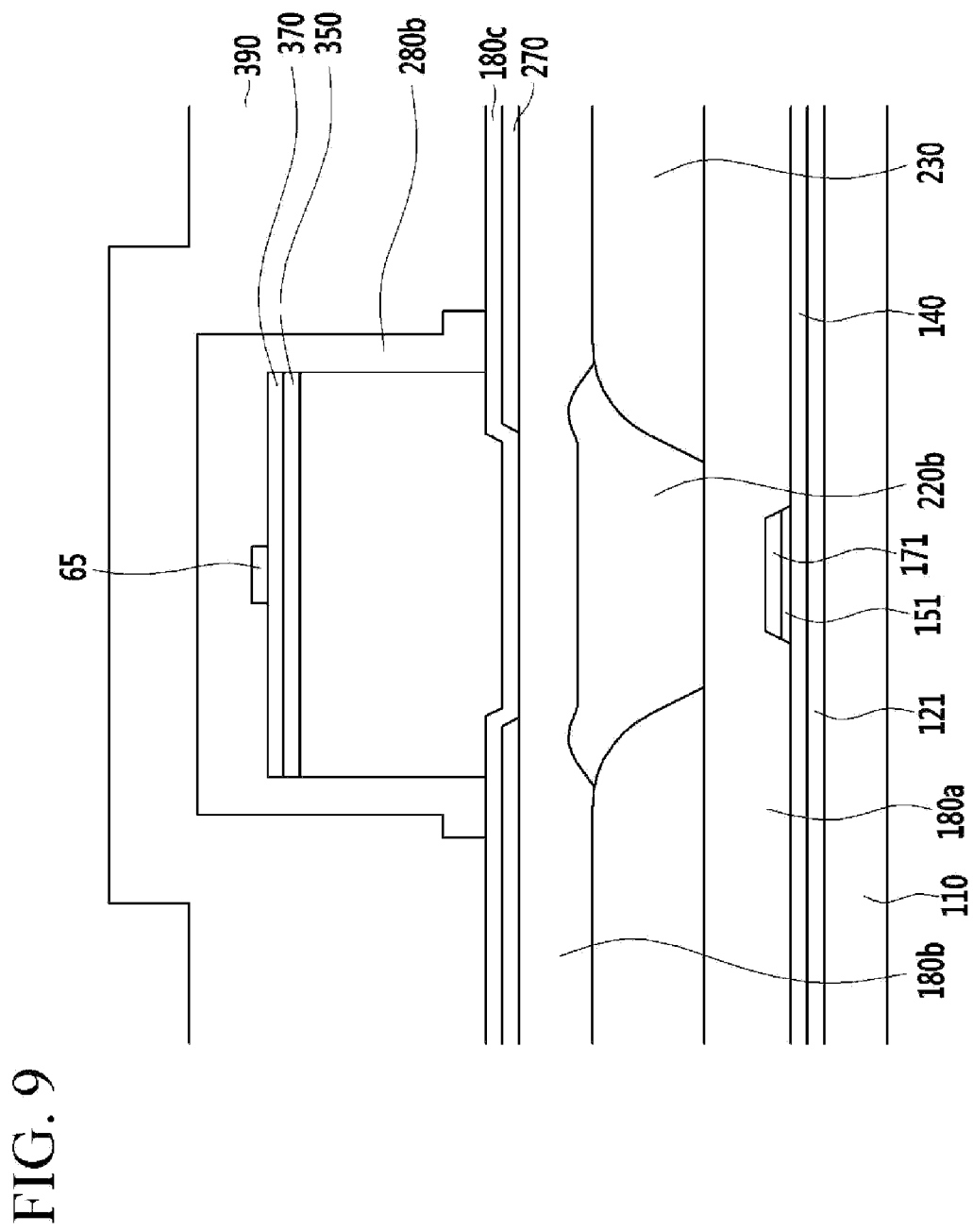
FIG. 9 shows a cross-sectional view illustrating a modified liquid crystal display according to an exemplary embodiment shown in FIG. 8.

FIG. 9 shows a cross-sectional view of a modified liquid crystal display according to an exemplary embodiment shown in FIG. 8.

The exemplary embodiment of FIG. 9 is similar to the exemplary embodiment of FIG. 8. However, the sacrificial layer residual film 300r is not present.

In addition to the above-described differences, the contents that are described with reference to FIG. 8 are applicable to the exemplary embodiment of FIG. 9.

FIG. 10 to FIG. 37 show top plan views and cross-sectional views of a method for manufacturing a liquid crystal display according to an exemplary embodiment of the present invention. In detail, FIGS. 11, 16, 19, 21, 32, and 36 show cross-sectional views with respect to a line V-V of FIG. 4 in a processing order. FIGS. 12, 17, 22, 24, and 25 show cross-sectional views with respect to a line VI-VI of FIG. 4 in processing order. FIGS. 18, 20, 23, 26, 27, 28, 29, 33, and 37 show cross-sectional views with respect to a line VII-VII of FIG. 4 in processing order.

Figure 11:
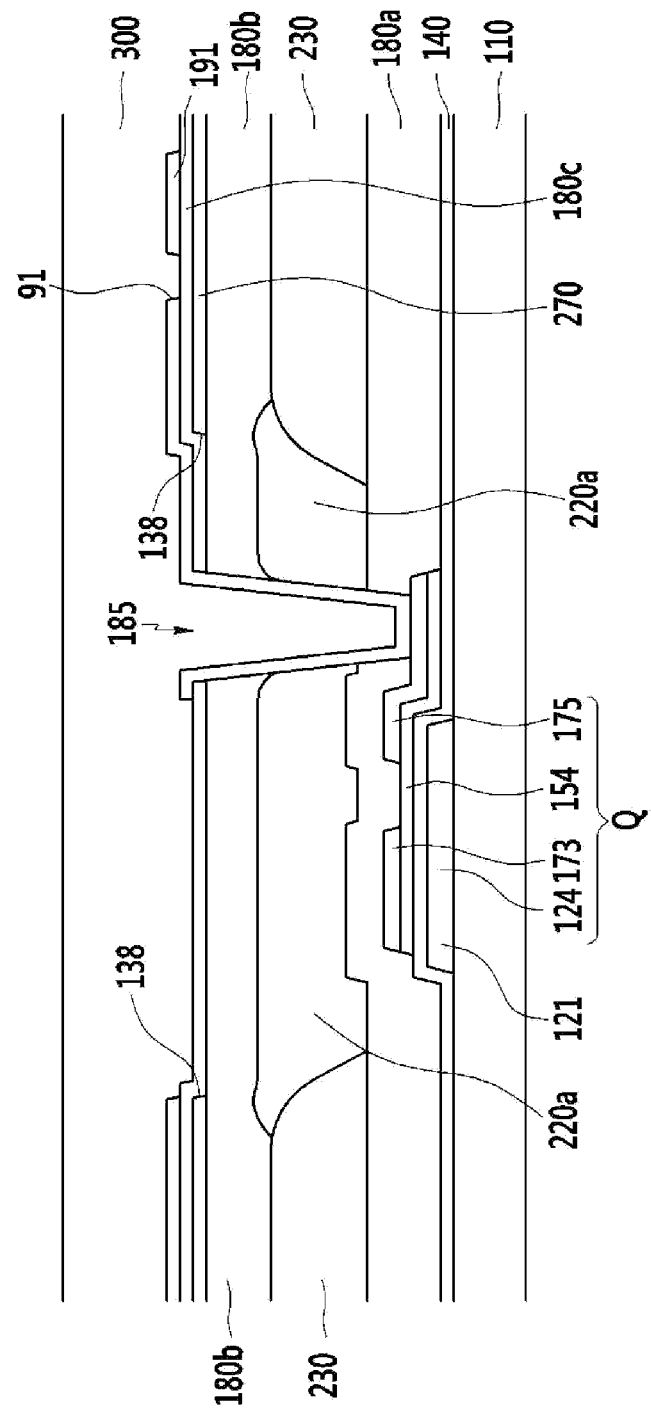
Figure 12:
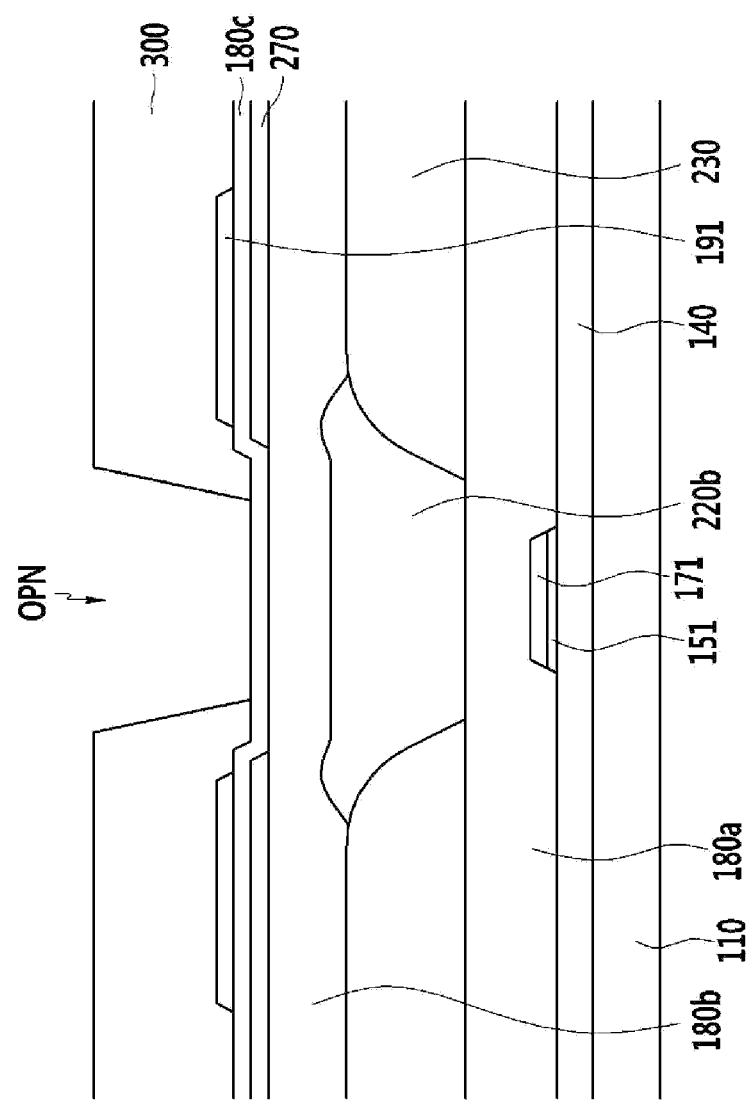

Referring to FIG. 4, FIG. 11, and FIG. 12, to form a generally known switching element on the substrate 110, a gate line 121 is formed to be extended in the horizontal direction and a gate insulating layer 140 is formed on the gate line 121, semiconductor layers 151 and 154 are formed on the gate insulating layer 140, and a source electrode 173 and a drain electrode 175 are formed. In this instance, the data line 171 connected to the source electrode 173 can be formed to cross the gate line 121 and extend in the vertical direction.

A first protection layer 180a is formed on the data conductors 171, 173, and 175 including the source electrode 173, the drain electrode 175, and the data line 171, and the exposed semiconductor layer 154.

A color filter 230 is formed on a position that corresponds to the pixel area on the first protection layer 180a, and light blocking members 220a and 220b are formed between color filter 230.

A second protection layer 180b for covering the color filter 230 and the light blocking members 220a and 220b are formed on the color filter 230 and the light blocking members 220a and 220b, and the second protection layer 180b is formed to have a contact hole 185 for electrically and physically connecting the pixel electrode 191 and the drain electrode 175.

A common electrode 270 having a planar shape is formed on the second protection layer 180b. The common electrode 270 includes an opening 138 disposed on a part overlapping the gate line 121 or the data line 171, and in another embodiment, the common electrode 270 disposed between the adjacent pixels may have a connection structure without the opening 138. An inter-layer insulating layer 180c is formed on the common electrode 270, and a pixel electrode 191 is formed on the inter-layer insulating layer 180c. The inter-layer insulating layer 180c is formed to have a contact hole 185 for electrically and physically connecting the pixel electrode 191 and the drain electrode 175 together with the first protection layer 180a and the second protection layer 180b.

The pixel electrode 191 includes a plurality of cutouts 91, and a plurality of branch electrodes 192 disposed between the neighboring cutouts 91.

Figure 10:
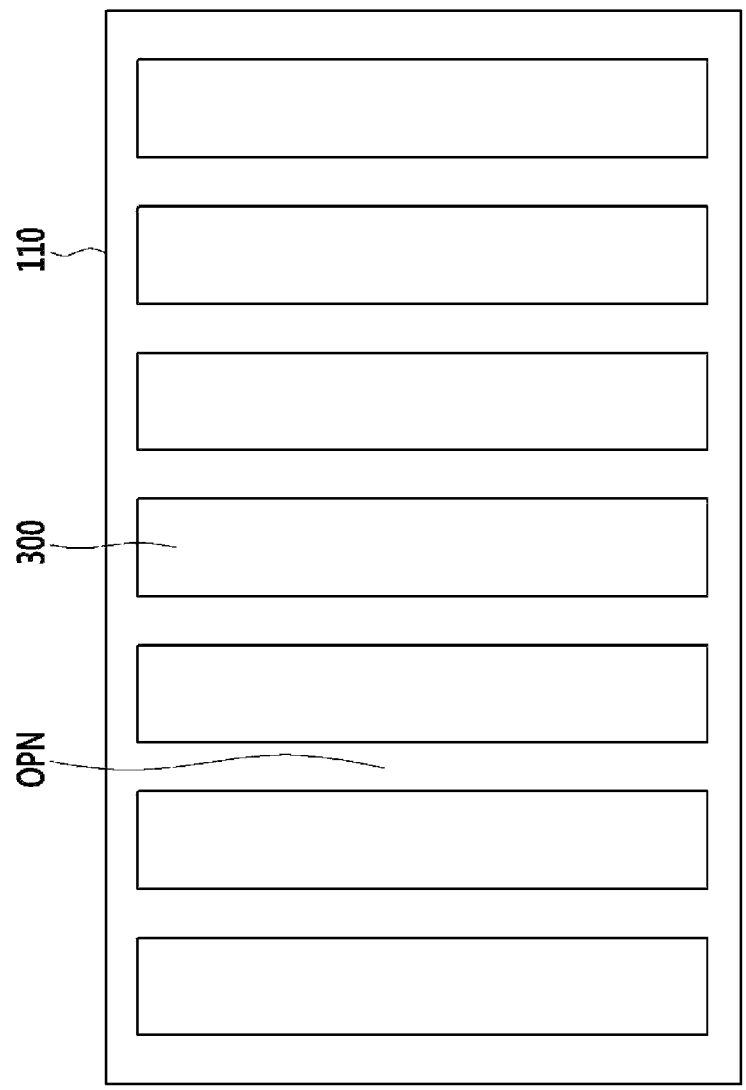
FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, FIG. 23, FIG. 24, FIG. 25, FIG. 26, FIG. 27, FIG. 28, FIG. 29, FIG. 30, FIG. 31, FIG. 32, FIG. 33, FIG. 34, FIG. 35, FIG. 36, and FIG. 37 show top plan views and cross-sectional views illustrating a method for manufacturing a liquid crystal display according to an exemplary embodiment of the present invention.

A sacrificial layer 300 is formed on the pixel electrode 191. As shown in FIG. 10 and FIG. 12, an open portion (OPN) is formed in a direction parallel to the data line 171 on the sacrificial layer 300. In a subsequent process, a lower insulating layer 350, a roof layer 360, and an upper insulating layer 370 are filled in the open portion (OPN) to form a partition wall forming portion (PWP).

Figure 13:
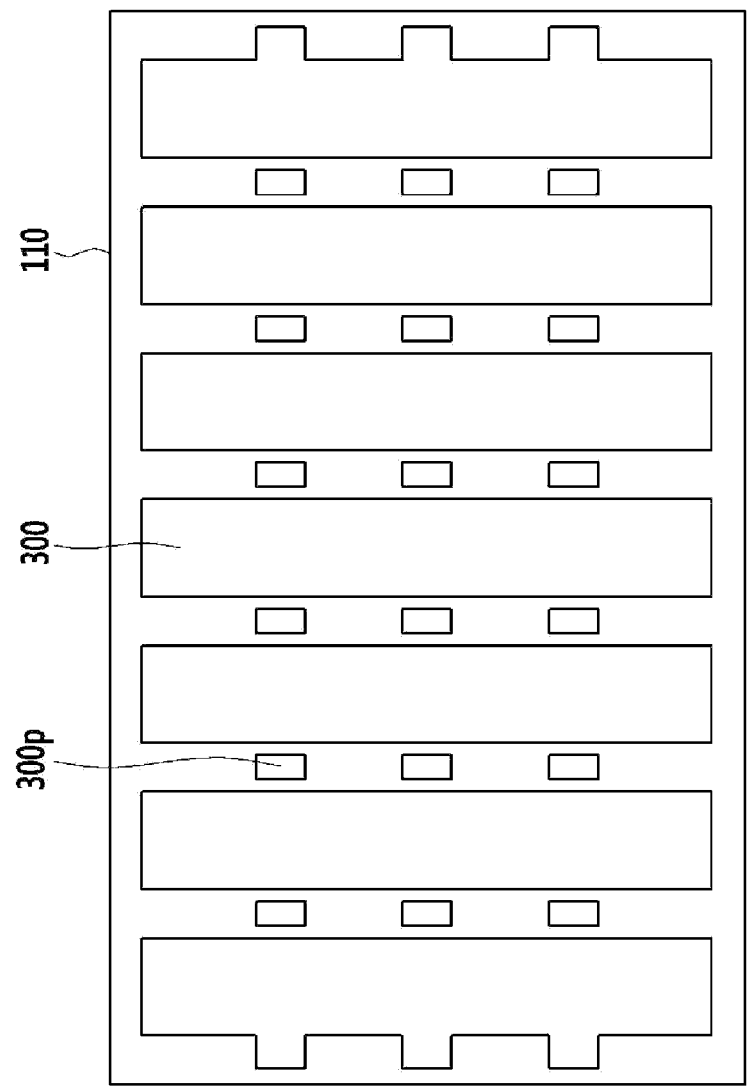

FIG. 13 shows a top plan view of a sacrificial layer configuration modified from the exemplary embodiment shown in FIG. 10.

Referring to FIG. 13, differing from the exemplary embodiment of FIG. 10, a plurality of sacrificial layer residual patterns 300p are formed between the sacrificial layers 300. A lower insulating layer and an upper insulating layer to be formed cover the upper side and the lateral side of the sacrificial layer residual pattern 300p to form the sacrificial layer residual film 300r after the process for removing the sacrificial layer 300 as shown in FIG. 8.

Figure 14:
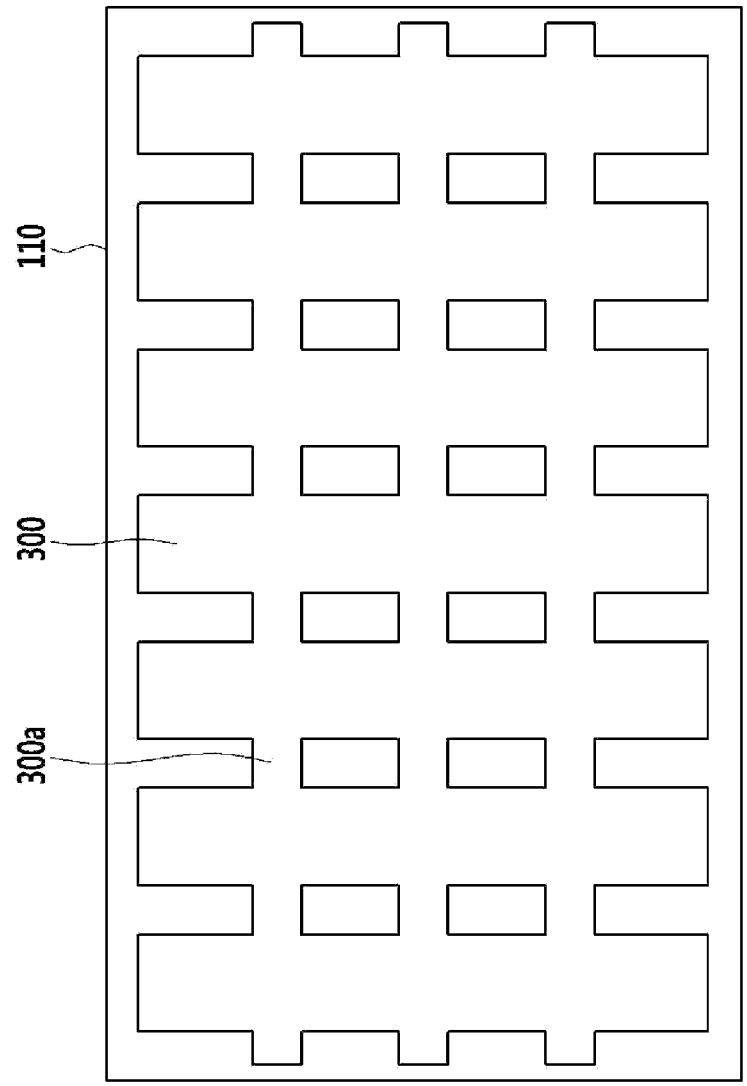

FIG. 14 shows a top plan view of a sacrificial layer modified from the exemplary embodiment of FIG. 10.

Referring to FIG. 14, differing from the exemplary embodiment of FIG. 10, a plurality of sacrificial layer connectors 300a are formed between the sacrificial layers 300. A lower insulating layer and an upper insulating layer to be formed are formed on the sacrificial layer connector 300a to function as a bridge so that a transparent conductive layer of the touch panel may be seamlessly connected in the vertical direction as shown in FIG. 9.

Figure 15:
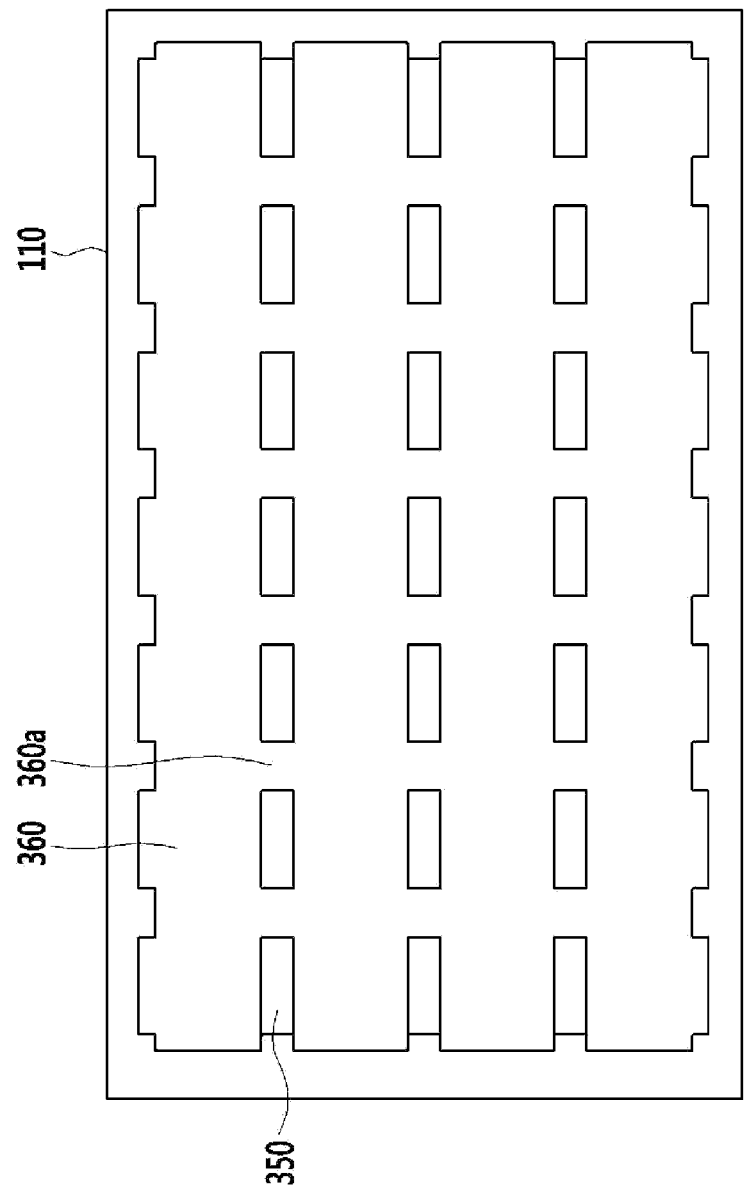
Figure 16:
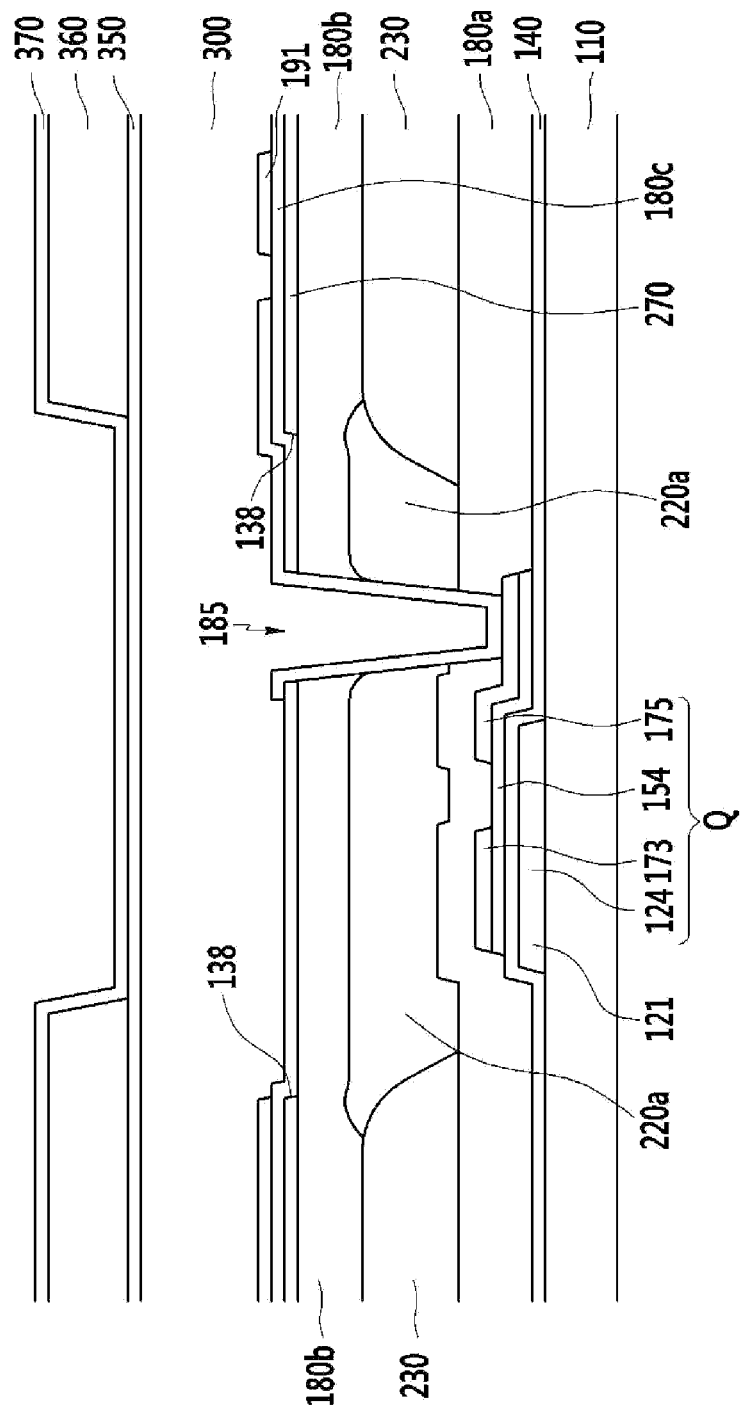
Figure 17:
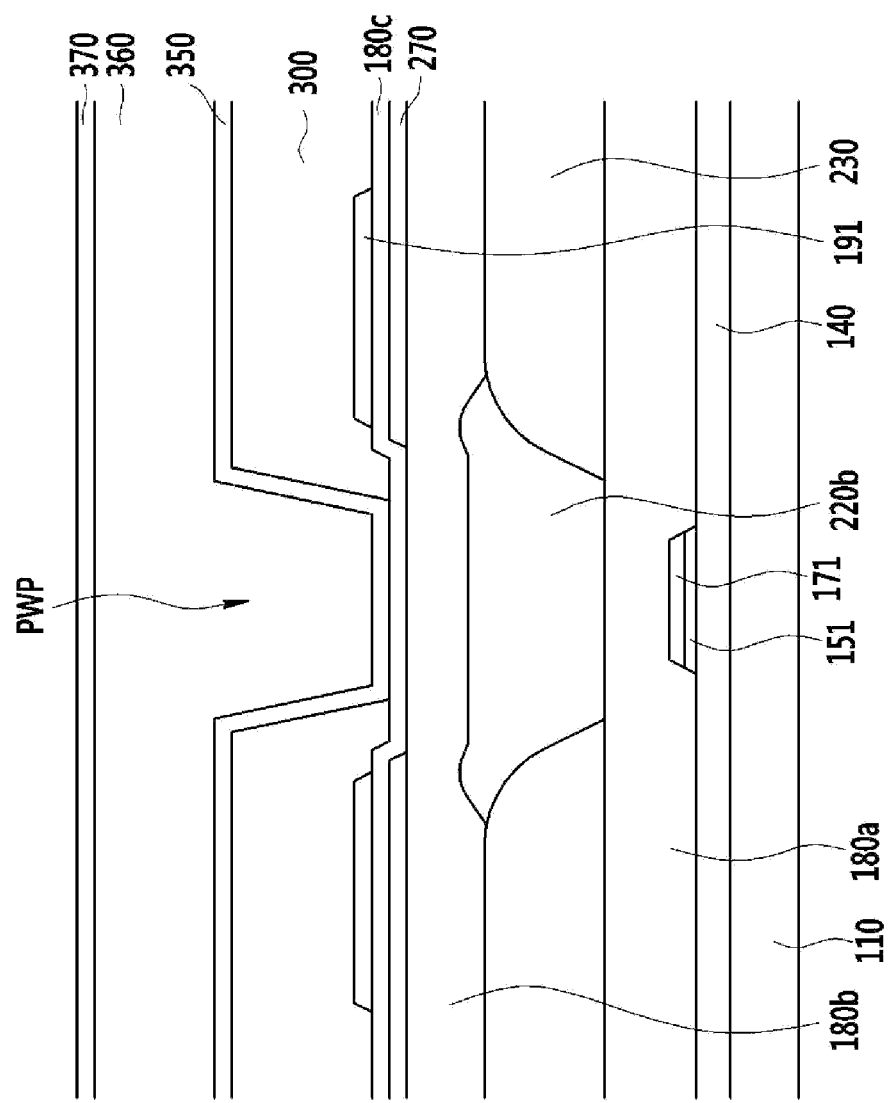
Figure 18:
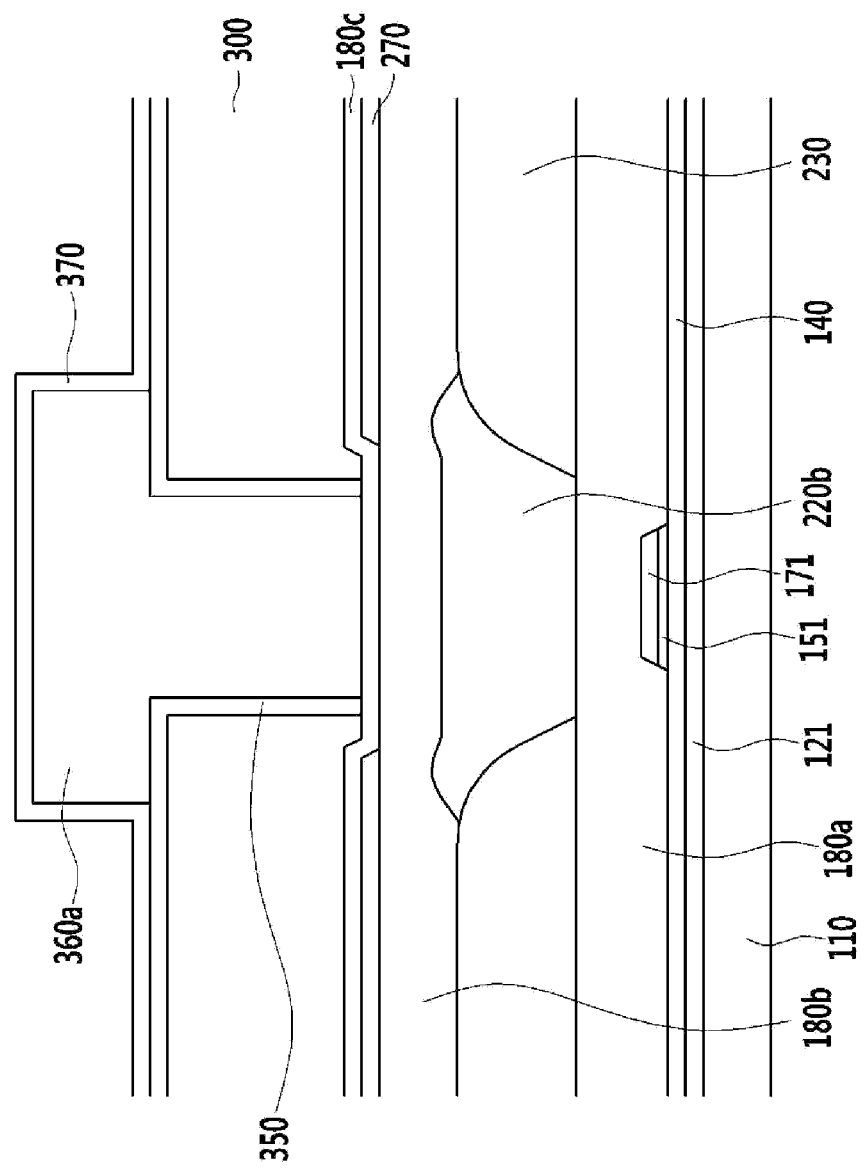

Referring to FIG. 16 to FIG. 18, a lower insulating layer 350 and a roof layer 360 are sequentially formed on the sacrificial layer 300. FIG. 15 shows a top plan view of a roof layer structure according to an exemplary embodiment of the present invention, and referring to FIG. 15 and FIG. 18, the roof layer 360 can be removed from the region that corresponds to the horizontal light blocking member 220a according to an exposure and development process. Therefore, the roof layer 360 exposes the lower insulating layer 350 in the region that corresponds to the horizontal light blocking member 220a. However, regarding the liquid crystal display according to the present exemplary embodiment, the roof layer 360 includes a connector 360a to have a perpendicular portion extending in the vertical direction. In other words, as shown in FIG. 15, the roof layer 360 has a matrix shape including a horizontal portion and a perpendicular portion.

As shown in FIG. 17, the lower insulating layer 350 and the roof layer 360 fill the open portion (OPN) of the perpendicular light blocking member 220b to form a partition wall forming portion (PWP).

The upper insulating layer 370 is formed to cover the roof layer 360 and the exposed lower insulating layer 350

Figure 19:
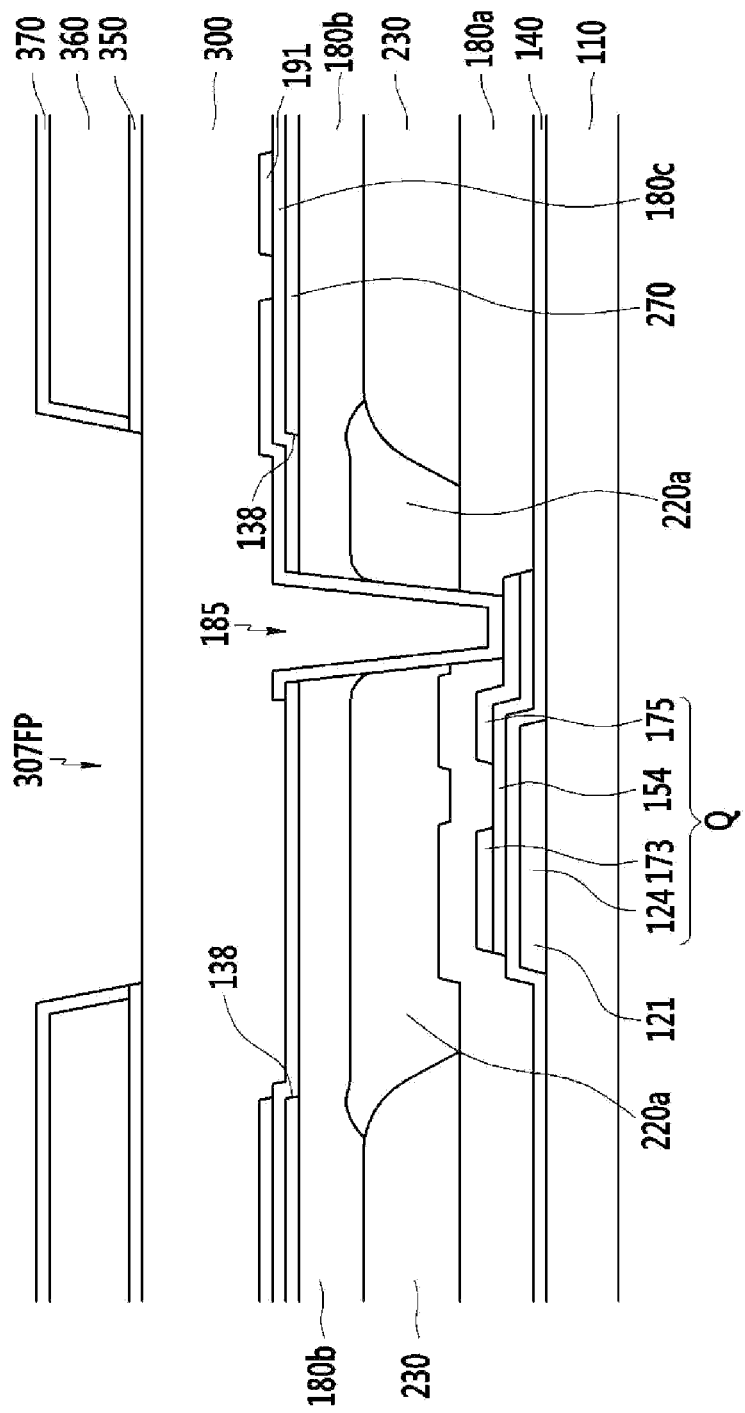
Figure 20:
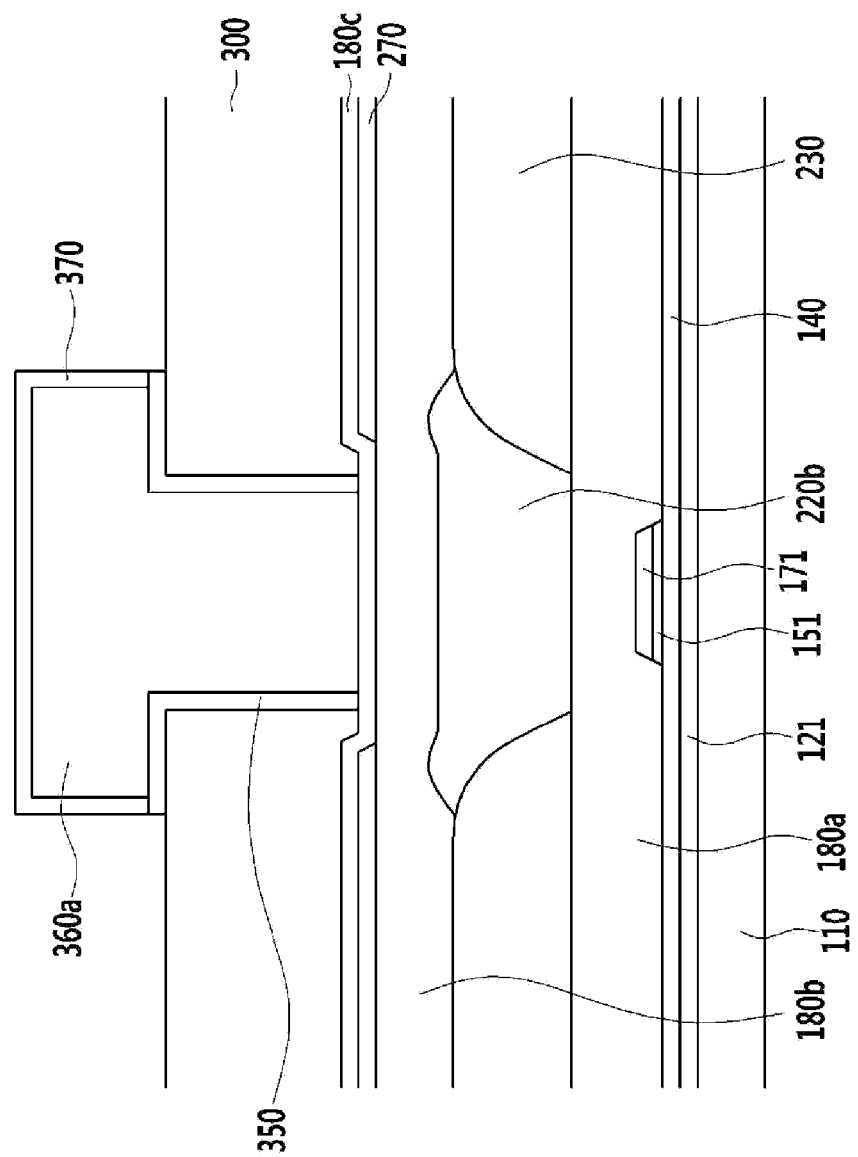

Referring to FIG. 19 and FIG. 20, the upper insulating layer 370 and the lower insulating layer 350 are dry-etched to partially remove the upper insulating layer 370 and the lower insulating layer 350 and form a liquid crystal injection hole forming region 307FP between neighboring pixel rows. In this instance, the upper insulating layer 370 can cover the lateral side of the roof layer 360, and without being restricted to this, the upper insulating layer 370 covering the lateral side of the roof layer 360 can be removed to expose the lateral side of the roof layer 360.

Figure 21:
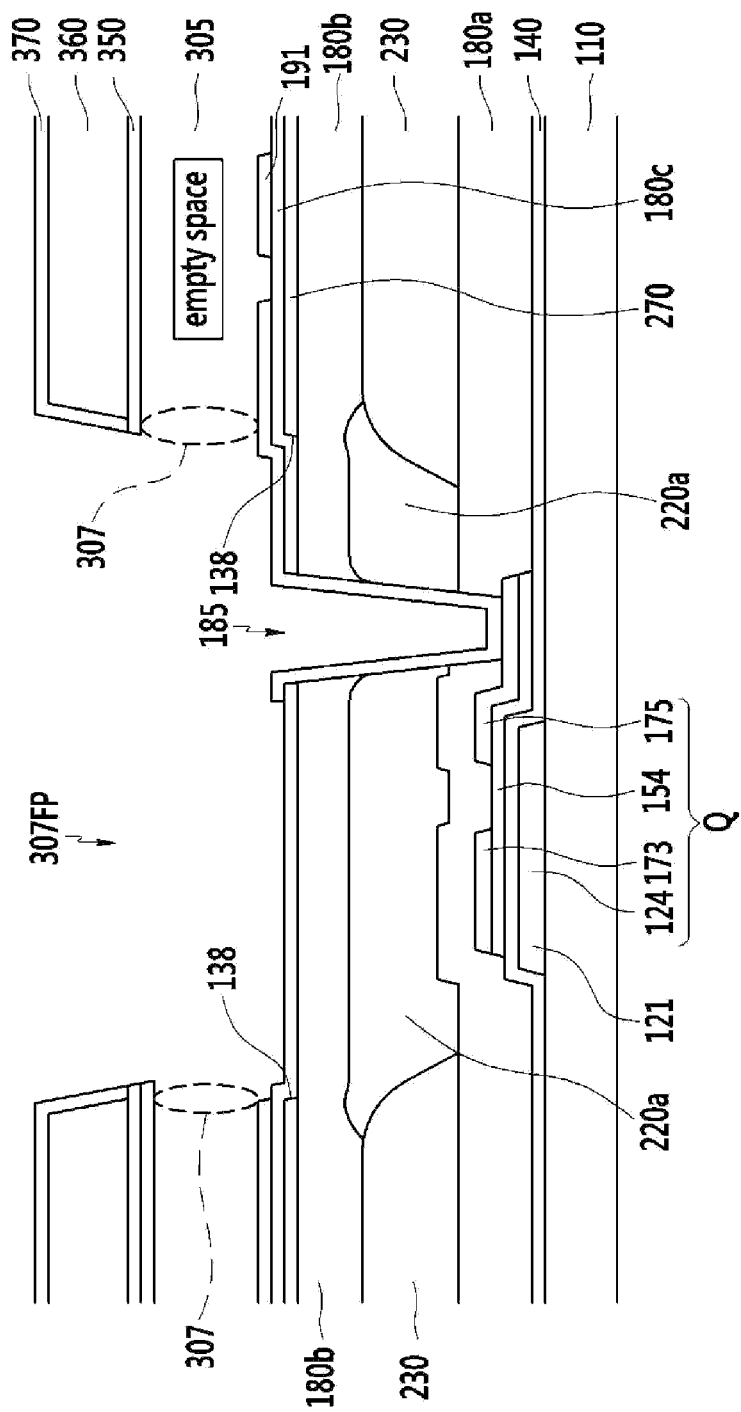
Figure 22:
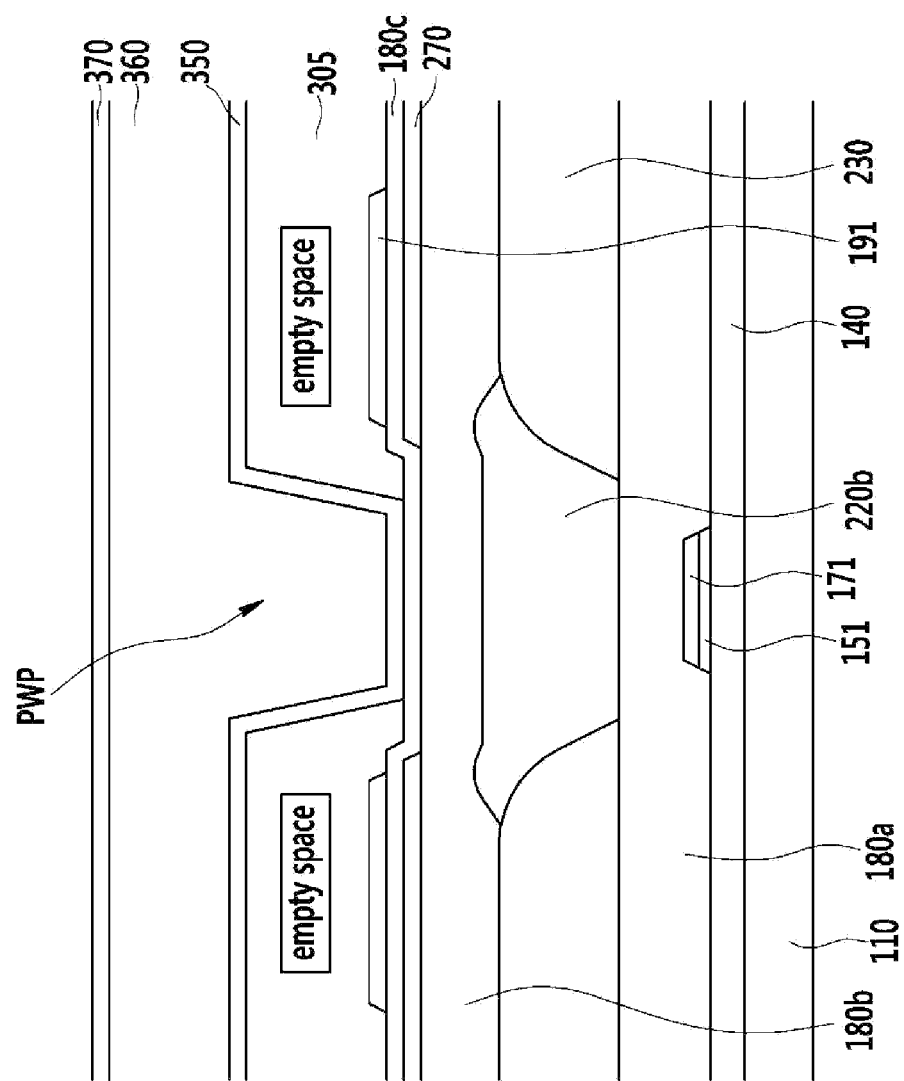
Figure 23:
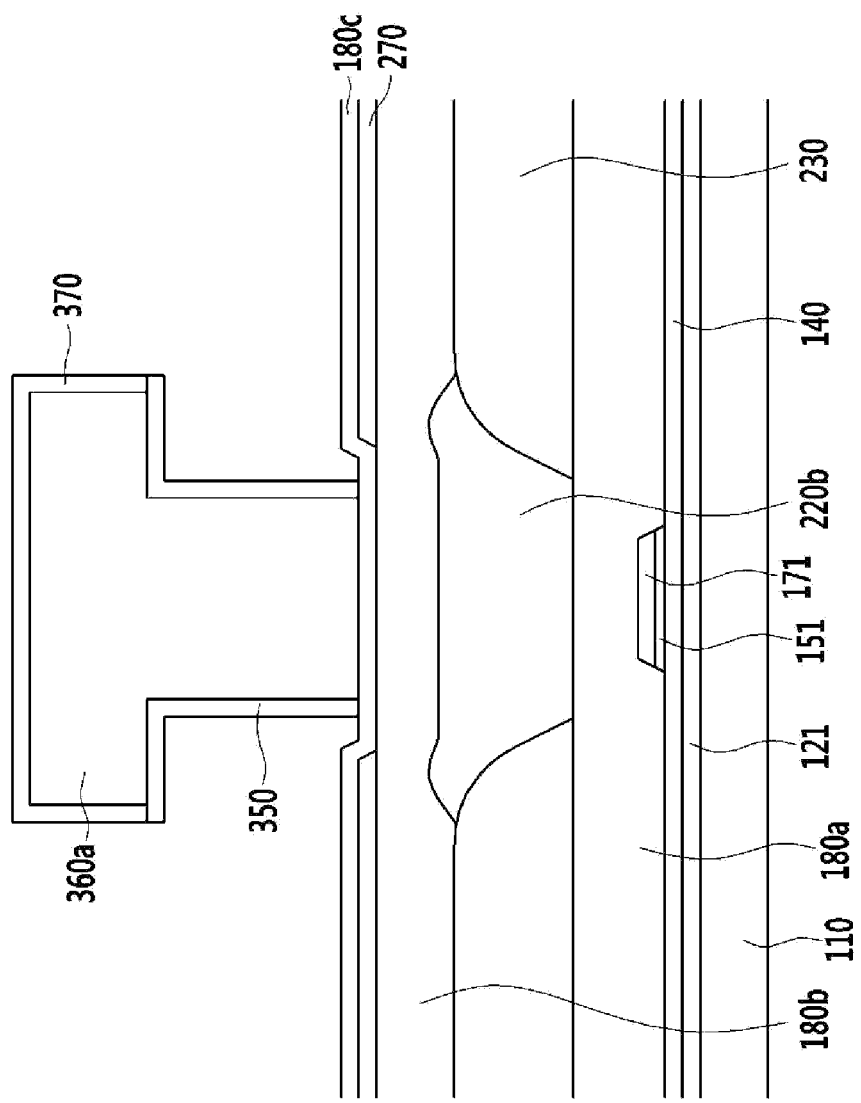

Referring to FIG. 21 to FIG. 23, the sacrificial layer 300 is removed through the liquid crystal injection hole forming region 307FP by an oxygen ($O_2$) ashing process or a wet-etching method. In this instance, a microcavity 305, including the liquid crystal injection hole 307, is formed. The microcavity 305 is an empty space because of removal of the sacrificial layer 300.

Figure 24:
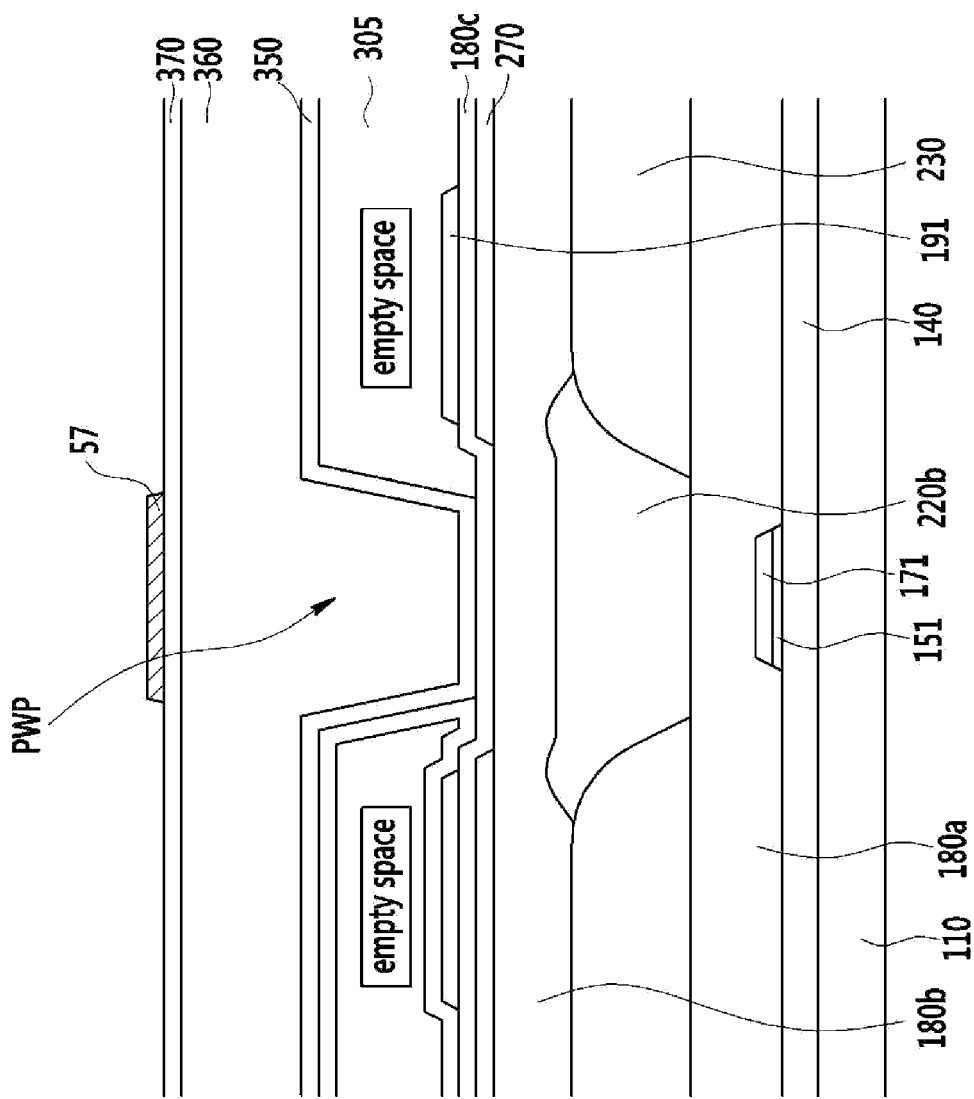

Referring to FIG. 24, an island connector 57 is formed on the upper insulating layer 370. The island connector 57 can be formed with a conductive material. As shown in FIG. 2, the island connector 57 can be separated into a plurality of island connectors, and can be formed according to the same process as the first touch signal line 51 and the second touch signal line 61.

Figure 25:
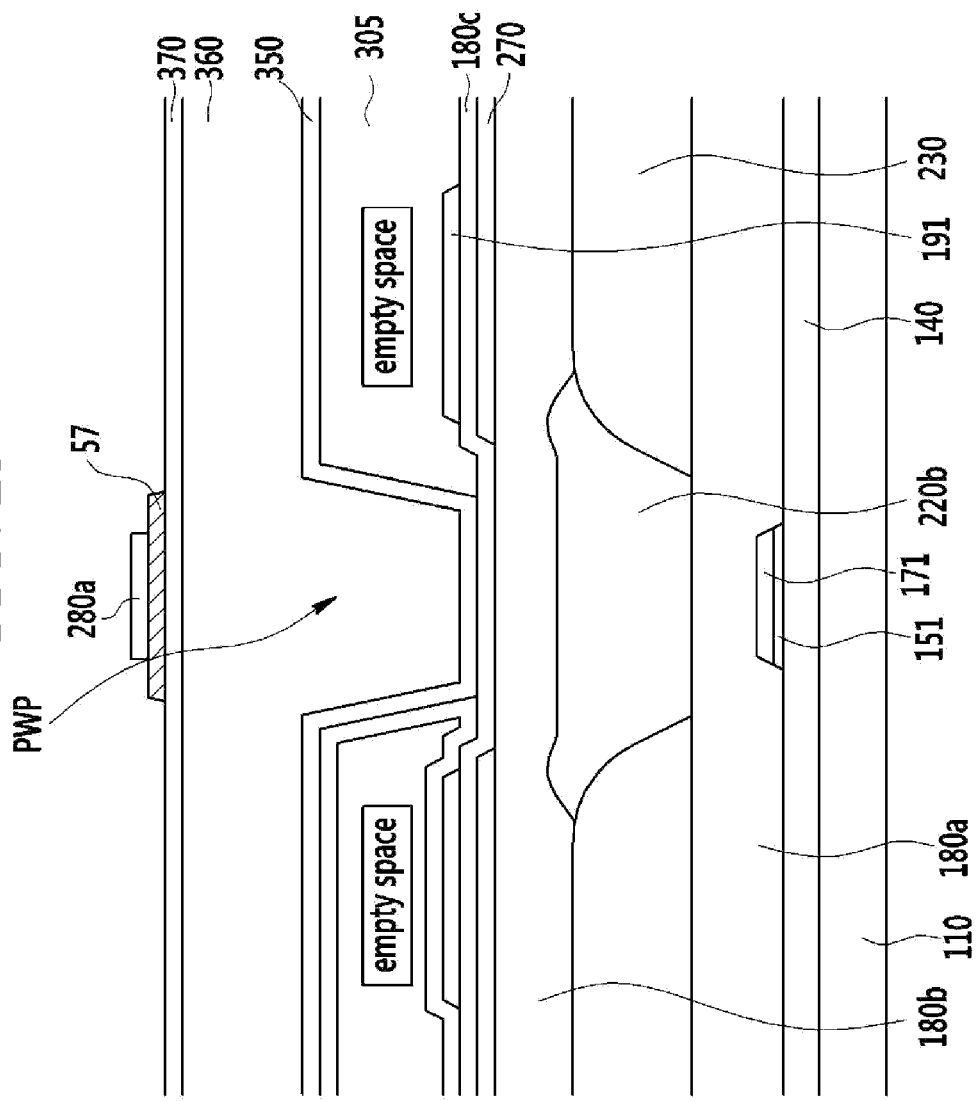

Referring to FIG. 25, an insulating material is formed on the island connector 57 and a patterning process is applied thereto to form a first insulating layer 280a. As shown in FIG. 2, a plurality of island-shaped first insulating layers 280a are formed in the display area (DA). In this instance, an insulating layer 280 can be formed to cover the first touch signal line 51 and the second touch signal line 61 in the peripheral area (PA).

Figure 26:
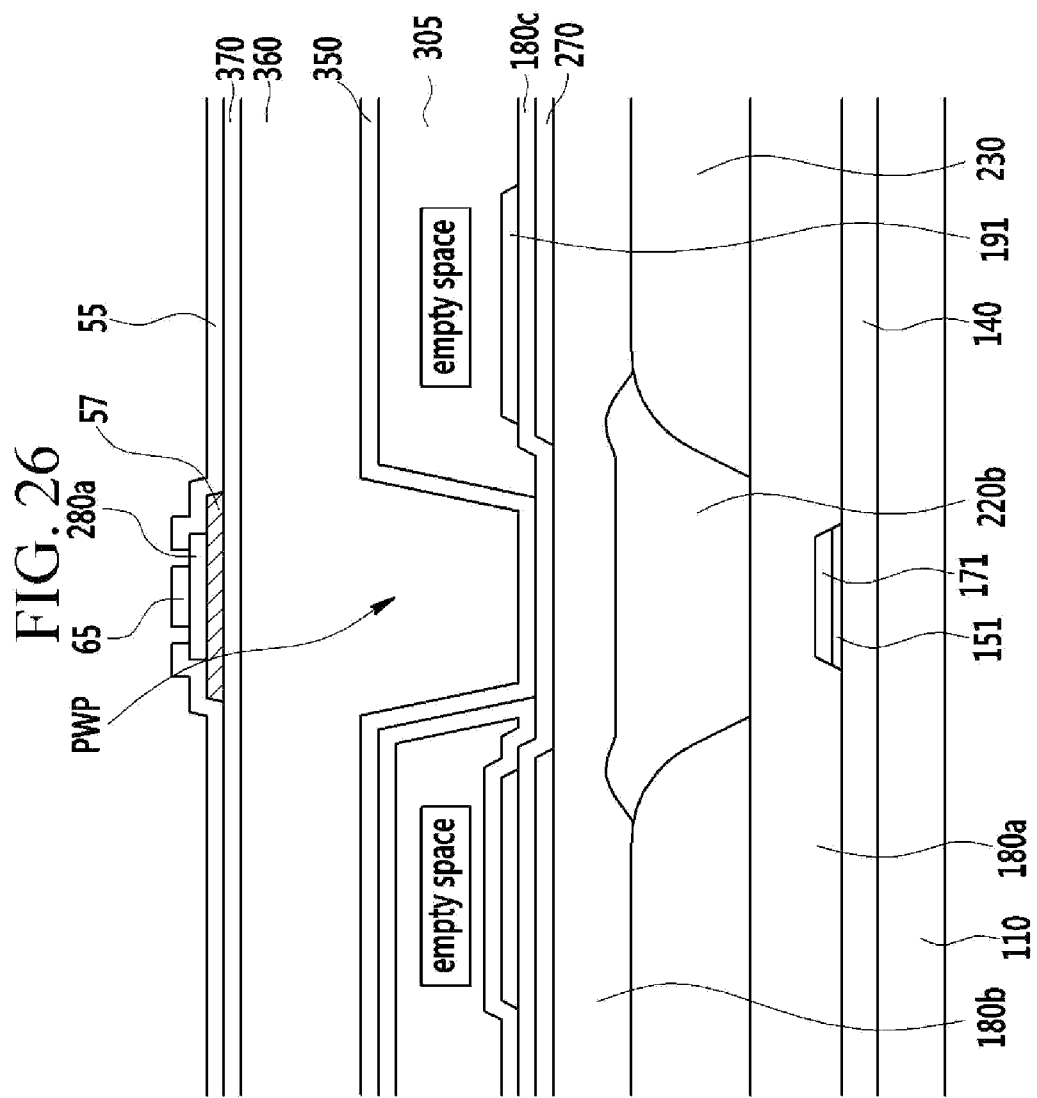
Figure 27:
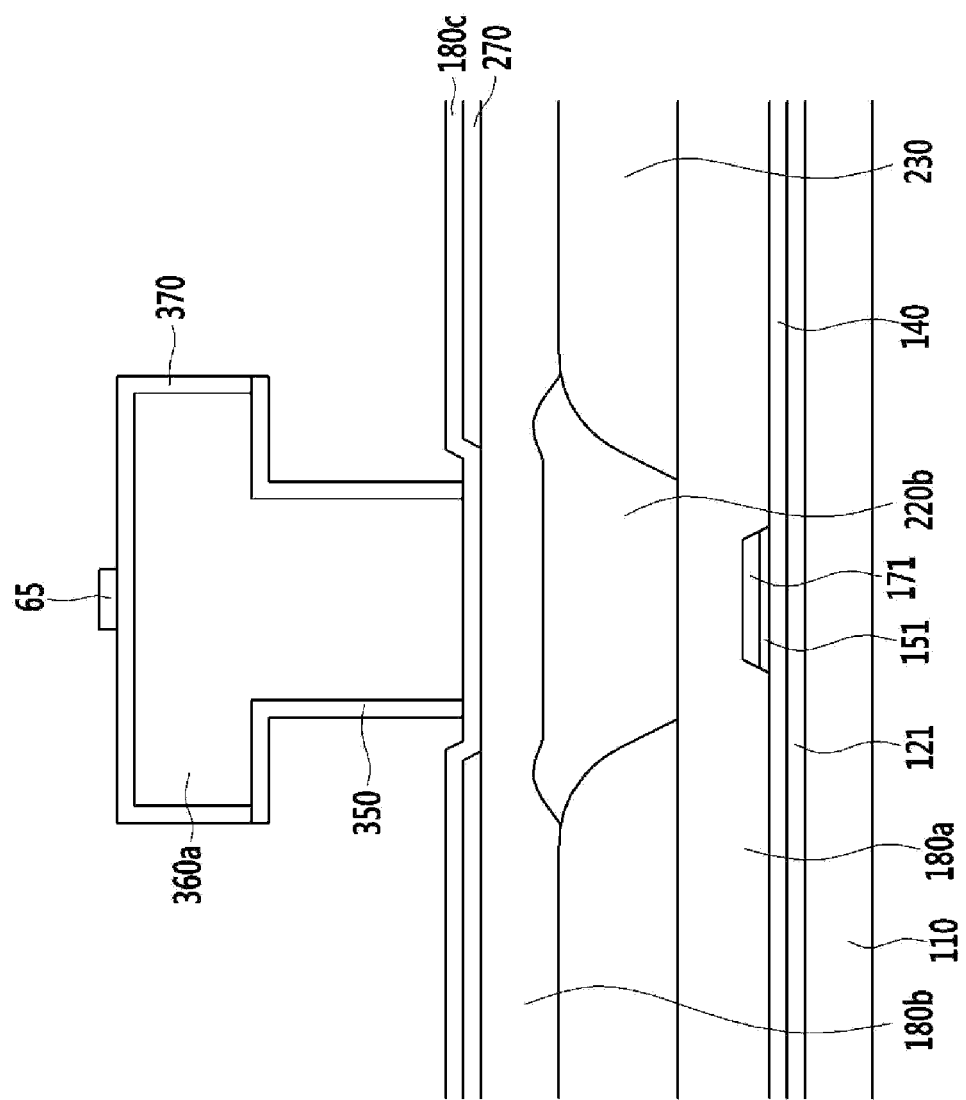

Referring to FIG. 26 and FIG. 27, a first transparent conductive layer 55 and a second transparent conductive layer 65 are formed on the upper insulating layer 370 or the first insulating layer 280a. First transparent conductive layers 55 are mainly extended in the row direction and first transparent conductive layers 55 between adjacent rows are parallel with each other as shown in FIG. 2, and second transparent conductive layers 65 are mainly extended in the column direction and second transparent conductive layers 65 between adjacent columns are formed to be parallel with each other as shown in FIG. 2. The first transparent conductive layer 55 is separately disposed from the second transparent conductive layer 65 to prevent electrically connection therebetween.

As shown in FIG. 2, the first transparent conductive layer 55 includes a plurality of portions that are physically separated from each other, so it is formed to contact the island connector 57, with the portions electrically connected to each other.

The second transparent conductive layer 65 is disposed to overlap the respective perpendicular portions of the lower insulating layer 350, the roof layer 360, and/or the upper insulating layer 370. The lower insulating layer 350, the roof layer 360, and/or the upper insulating layer 370 are connected between the neighboring pixel rows so the second transparent conductive layer 65 can be formed to be a single portion that is physically interconnected.

Figure 28:
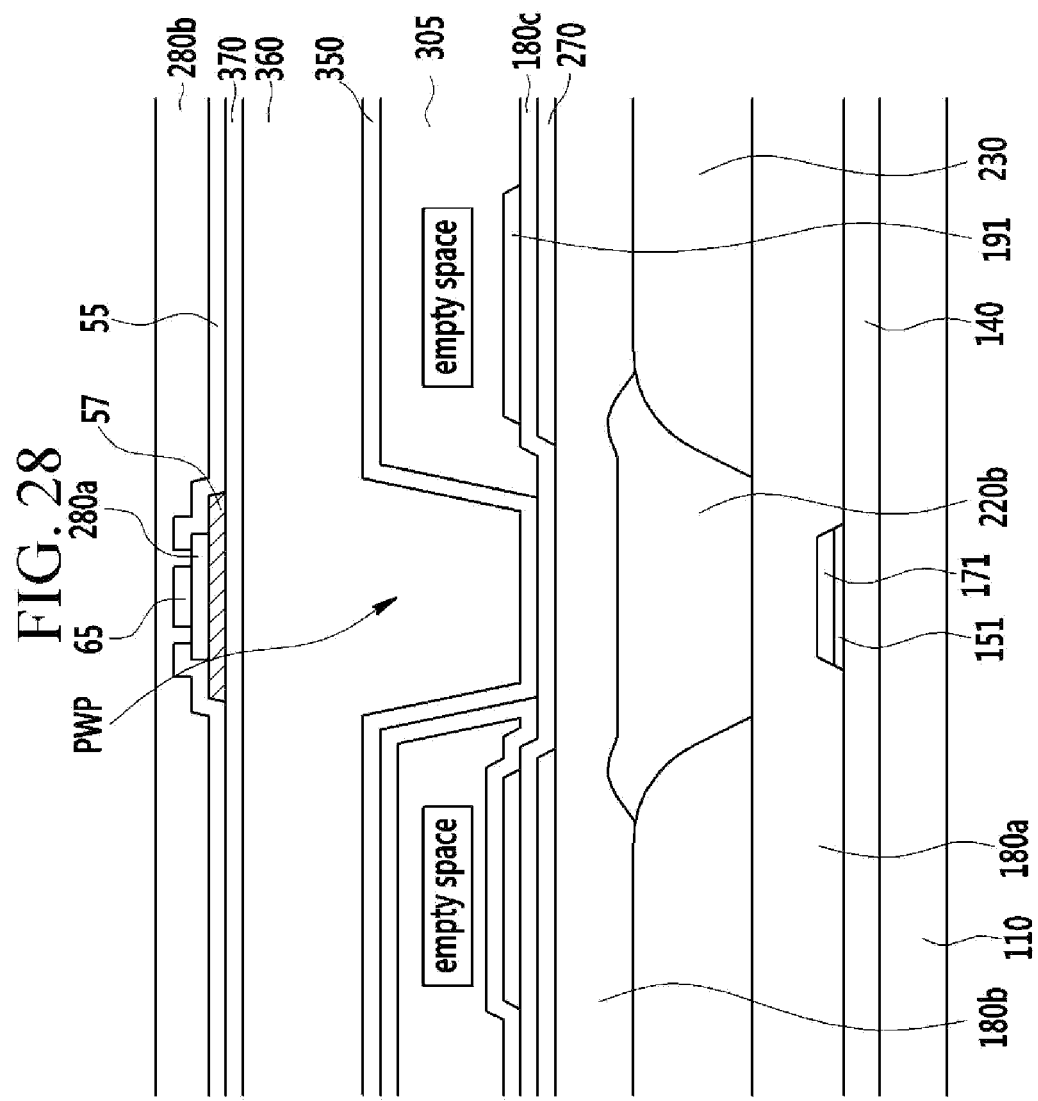
Figure 29:
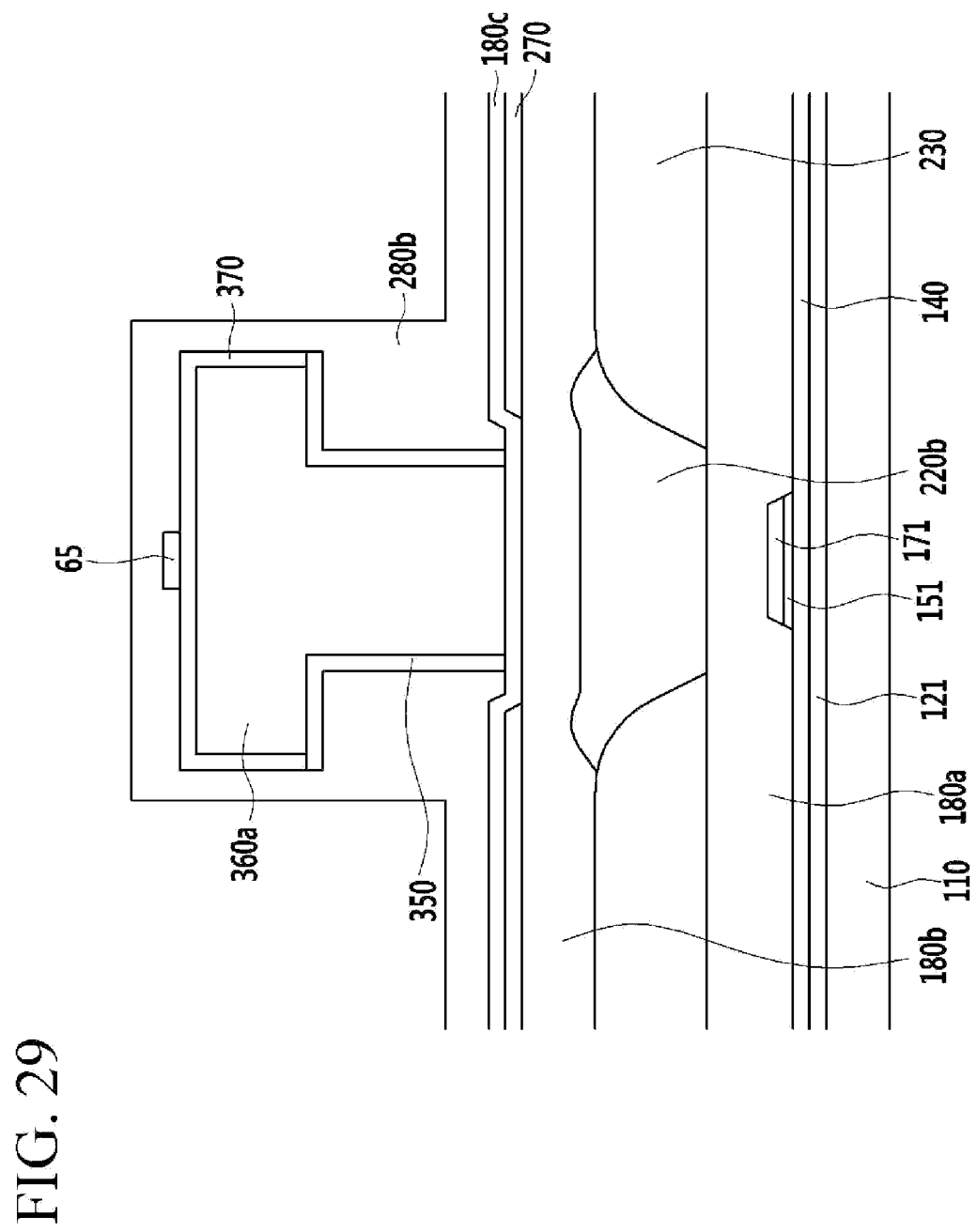

Referring to FIG. 28 and FIG. 29, a second insulating layer 280b is formed on the first transparent conductive layer 55 and the second transparent conductive layer 65 to insulate the first transparent conductive layer 55 and the second transparent conductive layer 65 crossing each other.

A method for forming a pixel pad and a touch pad will now be described with reference to FIG. 1, FIG. 2, and FIG. 30 to FIG. 35.

Figure 30:
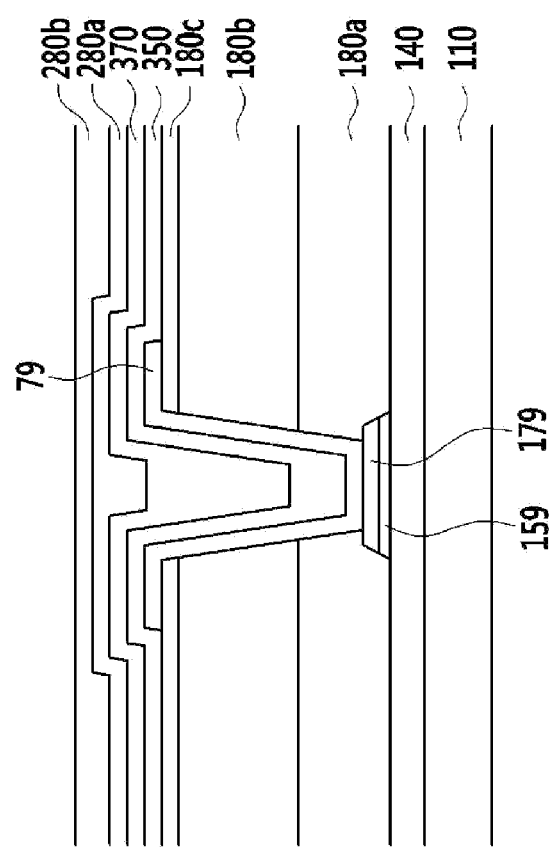
Figure 31:
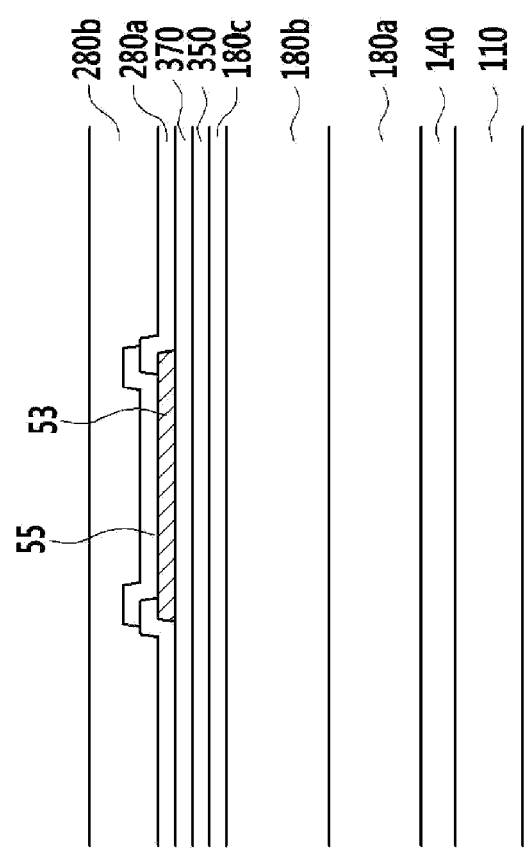
Figure 34:
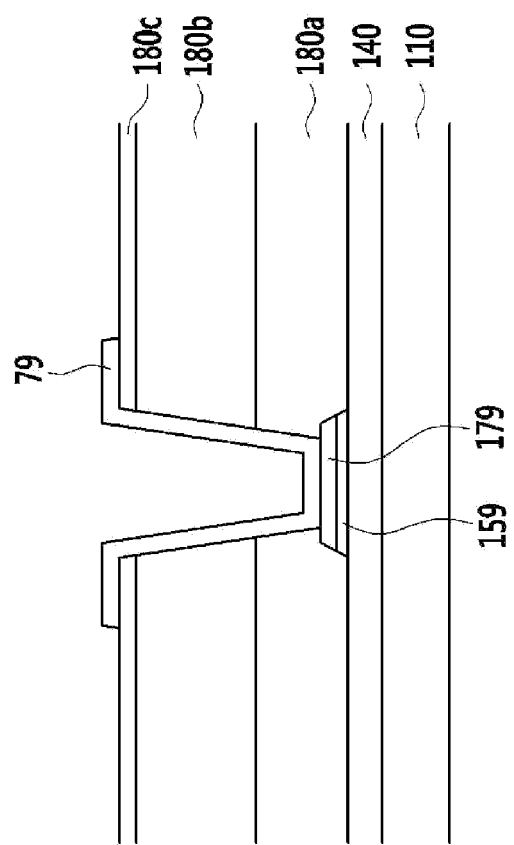
Figure 35:
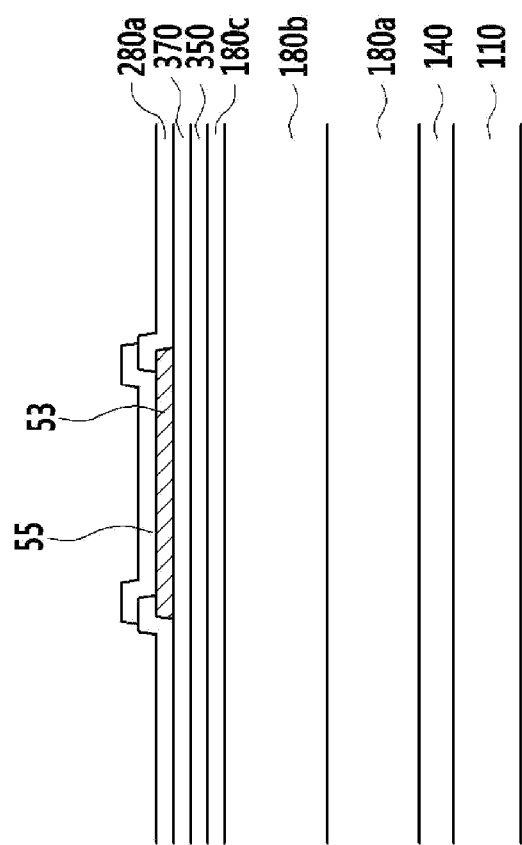

FIG. 30 and FIG. 34 show cross-sectional views with respect to a line A-A' of FIG. 1, and FIGS. 31 and 35 are cross-sectional views with respect to a line B-B' of FIG. 2.

Referring to FIG. 30 and FIG. 31, a gate insulating layer 140, a first protection layer 180a, a second protection layer 180b, an inter-layer insulating layer 180c, a lower insulating layer 350, an upper insulating layer 370, a first insulating layer 280a, and a second insulating layer 280b are stacked on respective bottoms and tops of the data pad 179 included in the pixel pad and the first pad 53 included in the touch pad when the second insulating layer 280b is formed. The lower insulating layer 350, the upper insulating layer 370, and the first insulating layer 280a are not removed but remain on the signal line such as the data pad 179 thereby preventing a contact assistant 79 from being damaged in the process for patterning the first transparent conductive layer 55 and the second transparent conductive layer 65 for forming a touch sensor.

A semiconductor 159 at a bottom of the data pad 179 shown in FIG. 30 represents a semiconductor material layer remaining in a process for simultaneously patterning the data pad 179 and a semiconductor material at the bottom of the same.

Figure 32:
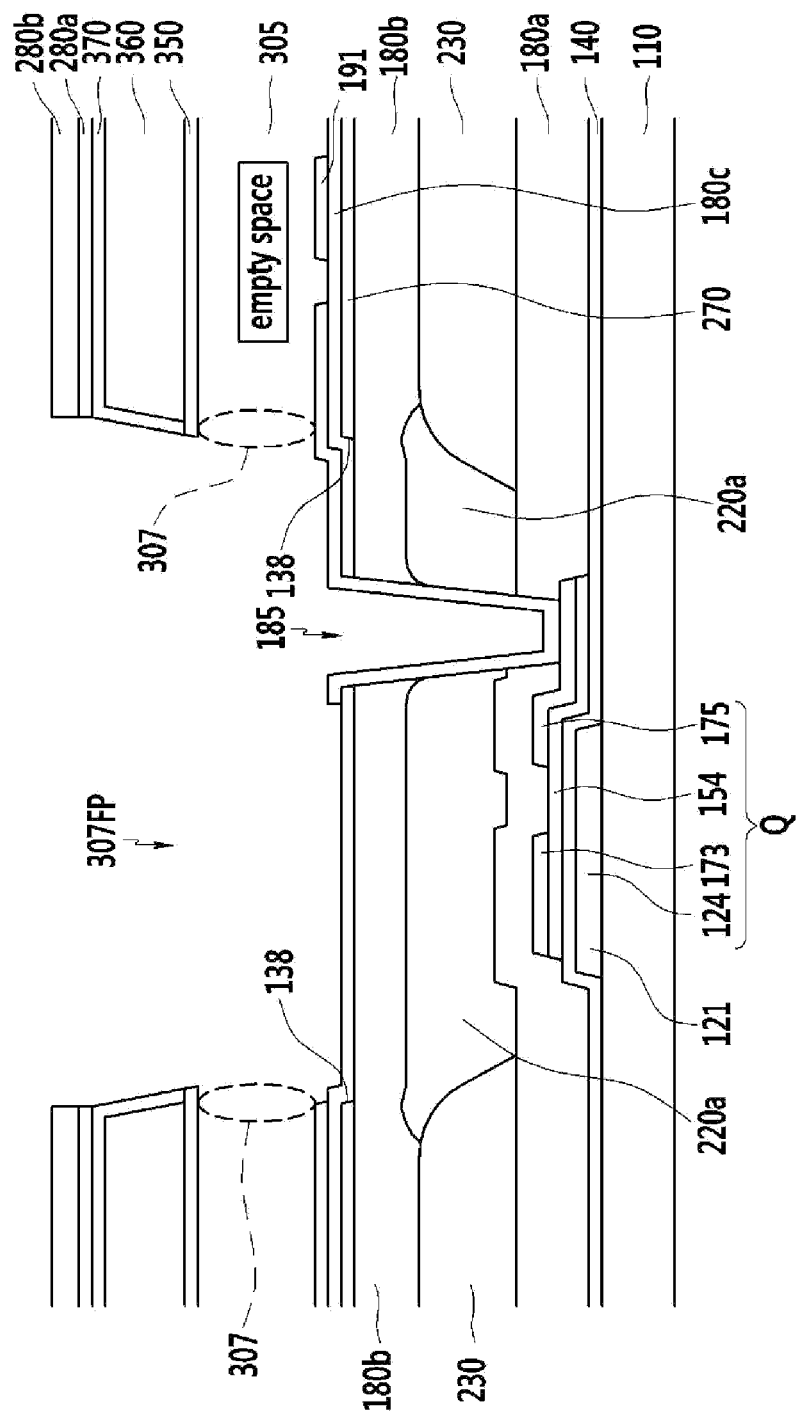
Figure 33:
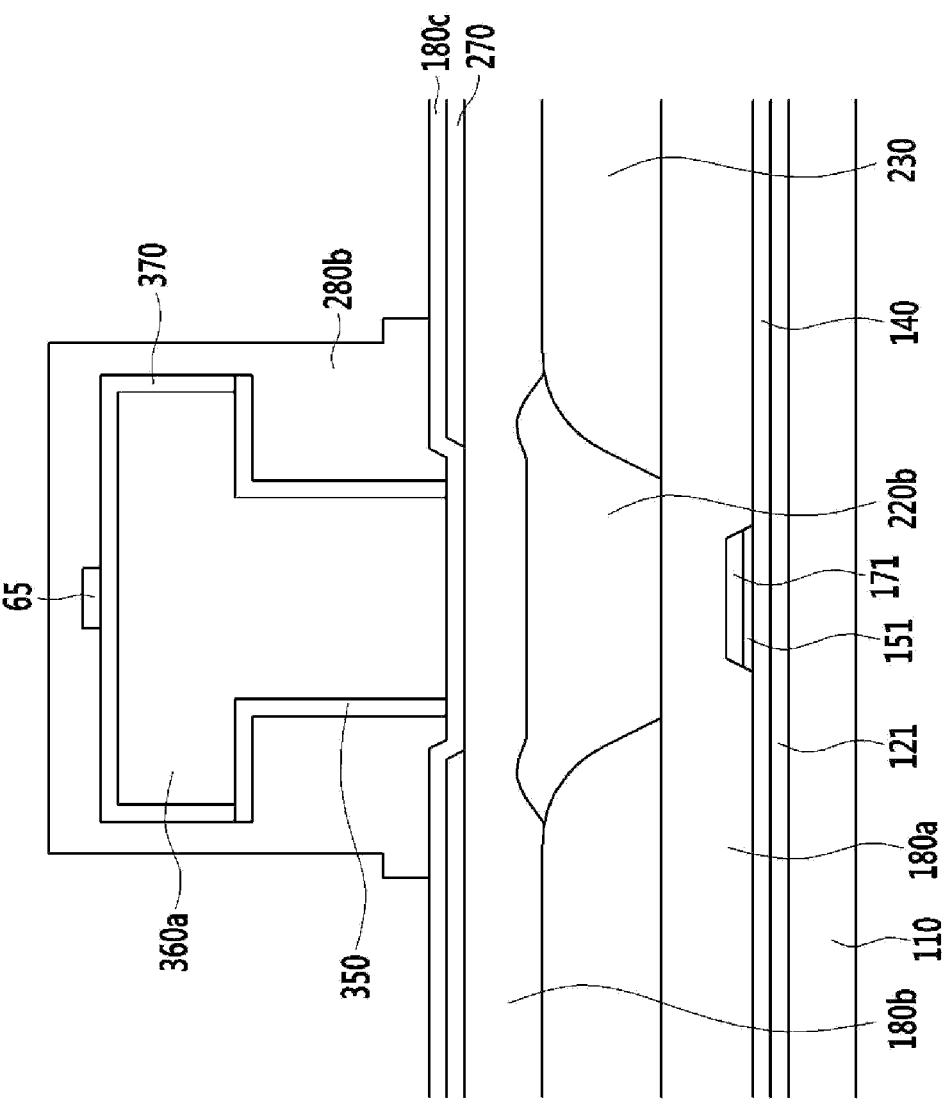

Referring to FIG. 32 to FIG. 35, the first insulating layer and the second insulating layer 280b are patterned to expose the liquid crystal injection hole forming region 307FP and the liquid crystal injection hole 307 as shown in FIG. 32, and allow the second insulating layer 280b to cover the connector 360a as shown in FIG. 33.

The lower insulating layer 350, the upper insulating layer 370, the first insulating layer 280a, and the second insulating layer 280b are simultaneously patterned to open the contact assistant 79 as shown in FIG. 34, and remove the second insulating layer 280b on the first pad 53 as shown in FIG. 35.

Figure 36:
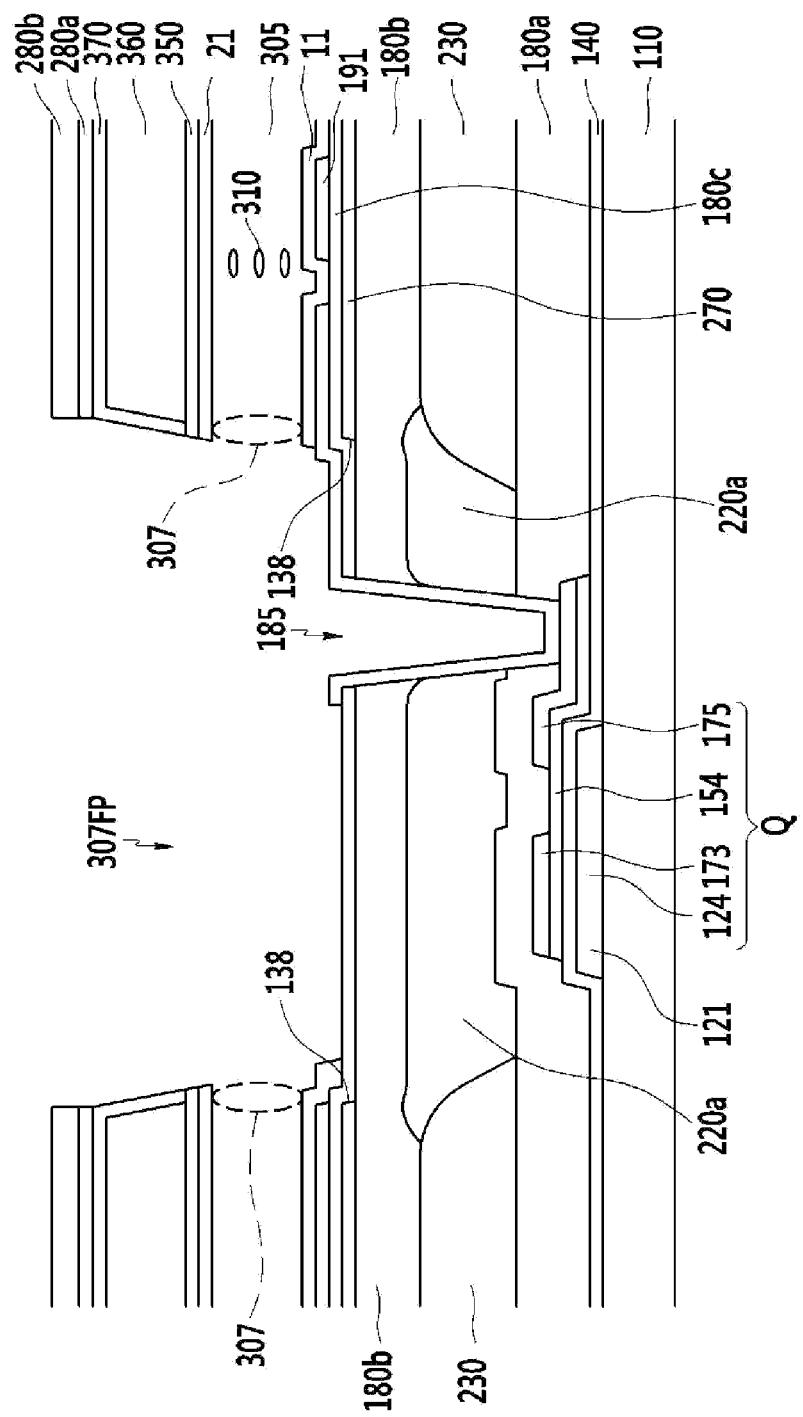
Figure 37:
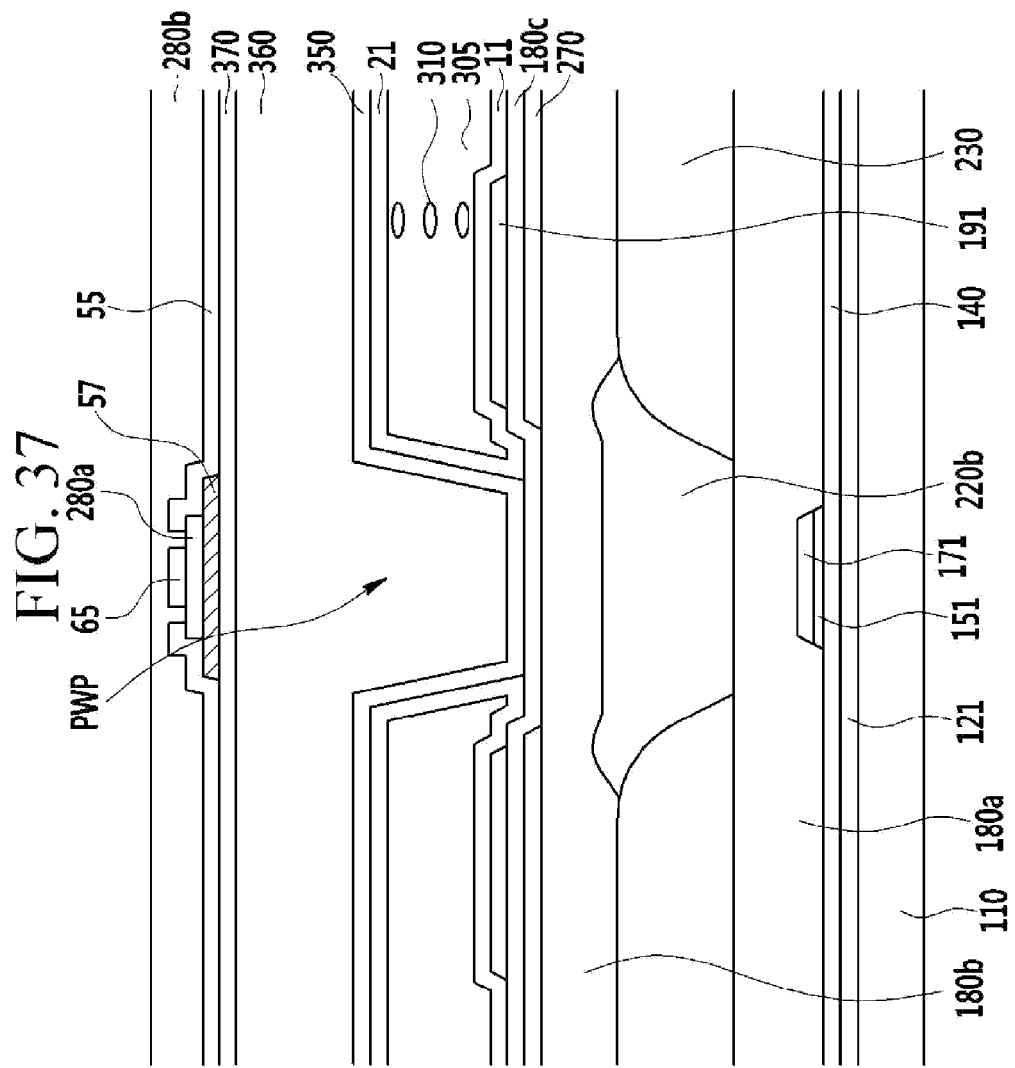

Referring to FIG. 36 and FIG. 37, an alignment material is injected through the liquid crystal injection hole 307. The alignment material is baked to form alignment layers 11 and 21 along an inner wall of the microcavity 305.

A liquid crystal material including liquid crystal molecules 310 is injected in the microcavity 305 through the liquid crystal injection hole 307 by using an inkjet method. The liquid crystal molecules 310 can be perpendicularly aligned.

When a capping layer 390 is formed to cover the liquid crystal injection hole 307 and the liquid crystal injection hole forming region 307FP on the second insulating layer 280b, the liquid crystal display shown in FIG. 1 to FIG. 7 can be formed.

According to exemplary embodiments of the present invention, the roof layer or the insulating layer are connected from top to bottom, and vertical axis wiring for forming the touch sensor is formed to correspond to the roof layer or the insulating layer.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. A liquid crystal display comprising:
   a substrate;
   a thin film transistor disposed on the substrate;
   a pixel electrode connected to the thin film transistor;
   a lower insulating layer facing the pixel electrode; and a touch sensor disposed on the lower insulating layer, the touch sensor comprising a first transparent conductive layer and a second transparent conductive layer, wherein:
- a plurality of microcavities are formed between the pixel electrode and the lower insulating layer;
- a liquid crystal layer comprising a liquid crystal material is disposed in the microcavities;
- the lower insulating layer has a matrix shape comprising a horizontal portion and a vertical portion; and
- the second transparent conductive layer overlaps the vertical portion of the lower insulating layer.

2. The liquid crystal display of claim 1, further comprising:
a roof layer disposed on the lower insulating layer,
wherein the roof layer has a matrix shape comprising a horizontal portion and a vertical portion.

3. The liquid crystal display of claim 2, wherein the second transparent conductive layer overlaps the vertical portion of the roof layer.

4. The liquid crystal display of claim 3, wherein the vertical portion of the lower insulating layer overlaps the vertical portion of the roof layer, and the vertical portion of the lower insulating layer and the vertical portion of the roof layer cross a gate line connected to the thin film transistor.

5. The liquid crystal display of claim 1, further comprising:
a roof layer disposed on the lower insulating layer; and
an upper insulating layer disposed on the roof layer,
wherein the roof layer comprises horizontal portions that are separated from each other, and the upper insulating layer contacts the vertical portion of the lower insulating layer.

6. The liquid crystal display of claim 5, wherein the upper insulating layer comprises horizontal and vertical portions, and the vertical portions of the upper insulating layer and the lower insulating layer contact each other at a point that crosses the gate line.

7. The liquid crystal display of claim 6, further comprising a sacrificial layer residual film disposed at a bottom of a portion where the vertical portions of the upper insulating layer and the lower insulating layer contact each other.

8. The liquid crystal display of claim 7, wherein the upper insulating layer and the lower insulating layer cover an upper surface and a lateral surface of the sacrificial layer residual film.

9. The liquid crystal display of claim 1, further comprising:
an island-shaped connector disposed at a portion where the first transparent conductive layer crosses the second transparent conductive layer,
wherein first transparent conductive layers are connected by the island-shaped connector.

10. The liquid crystal display of claim 9, further comprising:
a first insulating layer configured to insulate the island-shaped connector from the second transparent conductive layer; and
a second insulating layer configured to insulate the first transparent conductive layer from the second transparent conductive layer.

11. The liquid crystal display of claim 1, wherein:
the substrate comprises a display area and a peripheral area,
a pixel pad and a touch pad are disposed in the peripheral area, and the pixel pad does not overlap the touch pad.

* * * * *